United States Patent
Dunsky et al.

(10) Patent No.: US 6,433,301 B1
(45) Date of Patent: Aug. 13, 2002

(54) BEAM SHAPING AND PROJECTION IMAGING WITH SOLID STATE UV GAUSSIAN BEAM TO FORM VIAS

(75) Inventors: Corey M. Dunsky; Xinbing Liu; Nicholas J. Croglio; Ho W. Lo; Bryan C. Gundrum; Hisashi Matsumoto, all of Portland, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 0 days.

(21) Appl. No.: 09/580,396

(22) Filed: May 26, 2000

Related U.S. Application Data

(60) Provisional application No. 60/193,660, filed on Mar. 31, 2000, provisional application No. 60/175,098, filed on Jan. 7, 2000, and provisional application No. 60/136,568, filed on May 28, 1999.

(51) Int. Cl.[7] ............................................... B23K 26/38
(52) U.S. Cl. ............................. 219/121.67; 219/121.7; 219/121.75
(58) Field of Search ...................... 219/121.61, 121.67, 219/121.68, 121.69, 121.7, 121.71, 121.75

(56) References Cited

U.S. PATENT DOCUMENTS

| | | | |
|---|---|---|---|
| 3,848,104 A | 11/1974 | Locke | 219/121 L |
| 4,138,190 A | 2/1979 | Bryngdahl | 350/3.7 |
| 4,475,027 A | 10/1984 | Pressley | 219/121 L |
| 4,521,075 A | 6/1985 | Obenschain et al. | 350/162.11 |
| 4,789,770 A * | 12/1988 | Kasner et al. | 219/121.7 |
| 5,293,025 A * | 3/1994 | Wang | 219/121.71 |
| 5,300,756 A | 4/1994 | Cordingley | 219/121.69 |
| 5,453,594 A | 9/1995 | Konecny | 219/121.61 |
| 5,473,475 A | 12/1995 | Sweatt et al. | 359/869 |
| 5,559,338 A | 9/1996 | Elliott et al. | 250/492.1 |
| 5,593,606 A | 1/1997 | Owen et al. | 219/121.71 |
| 5,627,847 A | 5/1997 | Leger | 372/9 |
| 5,751,585 A | 5/1998 | Cutler et al. | 364/474.03 |
| 5,811,751 A | 9/1998 | Leong et al. | 219/121.6 |
| 5,841,099 A | 11/1998 | Owen et al. | 219/121.69 |
| 5,864,430 A | 1/1999 | Dickey et al. | 359/559 |
| 6,256,121 B1 * | 7/2001 | Lizotte et al. | 219/121.7 |

FOREIGN PATENT DOCUMENTS

| | | | |
|---|---|---|---|
| DE | 4034745 A1 | 7/1991 | B23K/26/02 |
| DE | 19619481 C1 | 11/1997 | |
| EP | 0976487 A1 | 2/2000 | B23K/26/06 |
| WO | WO 99/63793 | 12/1999 | H05K/3/00 |

OTHER PUBLICATIONS

Aleksoff, Carl C., Ellis, Kenneth K. Neagle, Bradley D., *Optical Engineering*, "Holographic conversion of a Gaussian beam to a near-field uniform beam," May 1991, vol. 30 No. 5, pp. 537–543.

Bass, Michael, Van Stryland, Eric W., Williams, David R., Wolfe, William L., *Handbook of Optics*, "Fundamentals, Techniques, and Design," vol. I, pp. 30.4–30.9.

(List continued on next page.)

*Primary Examiner*—Samuel M. Heinrich
(74) *Attorney, Agent, or Firm*—Stoel Rives LLP

(57) ABSTRACT

A diode-pumped, solid-state laser (52) of a laser system (50) provides ultraviolet Gaussian output (54) that is converted by a diffractive optical element (90) into shaped output (94) having a uniform irradiance profile. A high percentage of the shaped output (94) is focused through an aperture of a mask (98) to provide imaged to provide imaged shaped output (118). The laser system (50) facilitates a method for increasing the throughput of a via drilling process over that available with an analogous clipped Gaussian laser system. This method is particularly advantageous for drilling blind vias (20*b*) that have better edge, bottom, and taper qualities than those produced by a clipped Gaussian laser system. An alternative laser system (150) employs a pair of beam diverting galvanometer mirrors (152, 154) that directs the Gaussian output around a shaped imaging system (70) that includes a diffractive optical element (90) and a mask (98). Laser system (150) provides a user with the option of using either a Gaussian output or an imaged shaped output (118).

46 Claims, 14 Drawing Sheets

OTHER PUBLICATIONS

Bryngdahl, Olof, *Journal of the Optical Society of America*, "Geometrical transformations in optics," Aug. 1974, vol. 64, No. 8, pp. 1092–1099.

Dickey, Fred M., O'Neil, Burton D., *Optical Engineering*, "Multifaceted laser beam integrators: general formulation and design concepts," Nov. 1988, vol. 27, No. 11, pp. 999–1007.

Dixit, S.N., Lawson, J.K., Manes, K.R., and Powell, H.T., Nugent, K.A., *Optics Letters*, "Kinoform phase plates for focal plane irradiance profile control," Mar. 15, 1994, pp. 417–419.

Dunsky, Corey; Matsumoto, Hisashi; and Larson, Bonnie, "High Quality Microvia Formation with Imaged UV YAG Lasers," presented as a portion of the Technical Proceedings of the IPC Printed Circuits EXPO 2000 in San Diego, California on Apr. 6, 2000.

Lee, Wai–Hon, *Optics Communication*, "Method for Converting a Gaussian Laser Beam into a Uniform Beam," Mar. 15, 1981, vol. 36, No. 6, pp. 469–471.

Sharp, Greg, Kathman, Alan, *Industrial Laser Review*, "Laser beam shapes for the future," Dec. 1994, 2 pp.

Swanson, Gary J., Veldkamp, Wilfrid B., *Optical Engineering*, "Diffractive optical elements for use in infrared systems," Jun. 1989, vol. 28, No. 6, pp. 605–608.

Sweatt, William C., *Optical Engineering*, "Transforming a circular laser beam into a square or trapezoid–almost," Feb. 1992, vol. 31, No. 2, pp. 245–250.

Veldkamp, W.B., *Applied Optics*, "Laser beam profile shaping with interlaced binary diffraction gratings," Sep. 1, 1982, vol. 21, No. 17, pp. 3209–3212.

* cited by examiner

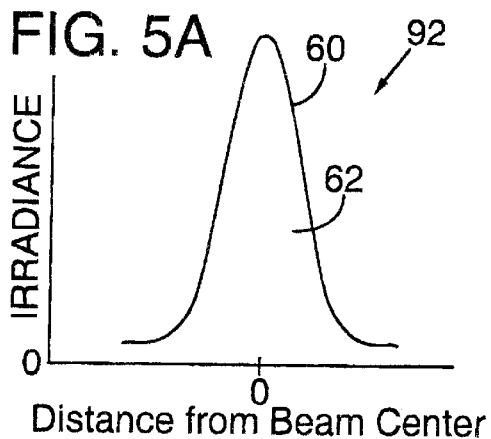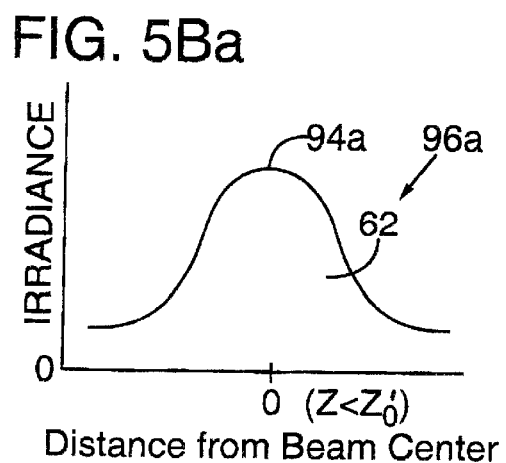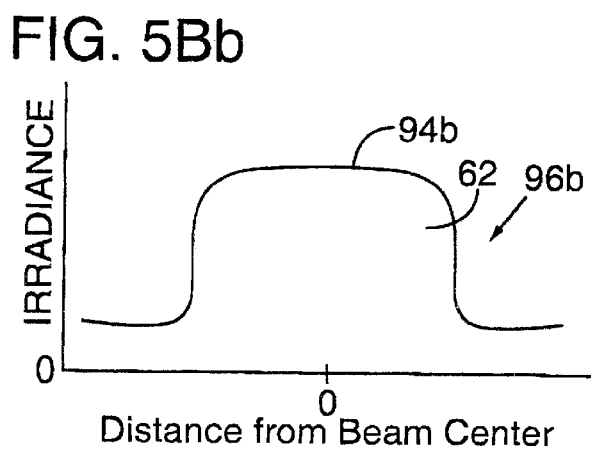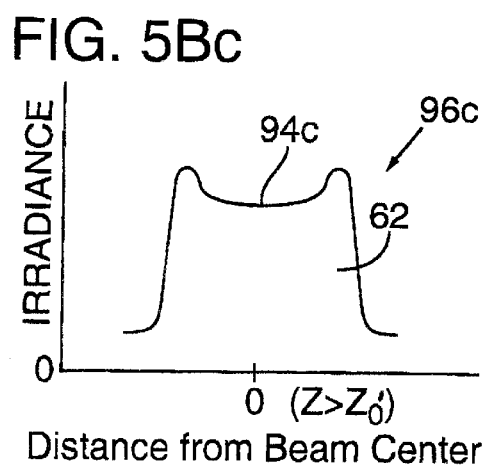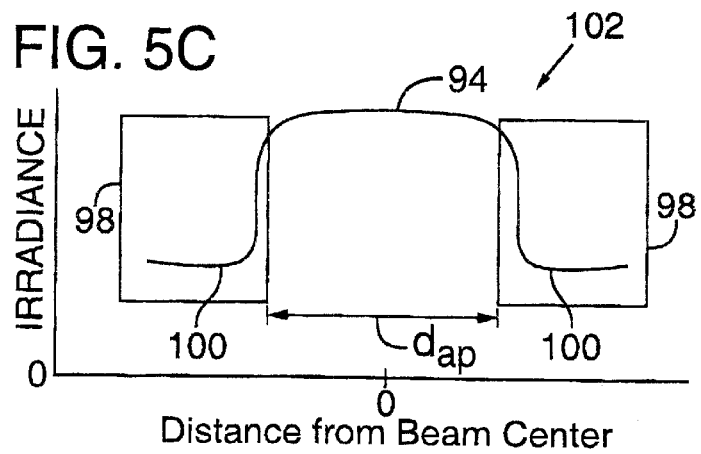

75 μm via in 45 μm epoxy resin

75 μm via in a 150 μm pre-etched copper opening

BEAM SHAPING AND PROJECTION IMAGING WITH SOLID STATE UV GAUSSIAN BEAM TO FORM VIAS

This patent application derives priority from U.S. Provisional Application No. 60/193,660, filed Mar. 31, 2000, from U.S. Provisional Application No. 60/175,098, filed Jan. 7, 2000, and from U.S. Provisional Application No. 60/136,568, filed May 28, 1999.

TECHNICAL FIELD

The invention relates to a diode-pumped solid-state laser and, in particular, to employing such a laser to generate an ultraviolet laser beam having a TEM$_{00}$ non-astigmatic spatial mode to drill vias.

BACKGROUND OF THE INVENTION

U.S. Pat. Nos. 5,593,606 and 5,841,099 of Owen et al. describe techniques and advantages for employing UV laser systems to generate laser output pulses within advantageous parameters to form through-hole or blind vias through at least two different types of layers in multilayer devices. These parameters generally include nonexcimer output pulses having temporal pulse widths of shorter than 100 ns, spot areas with spot diameters of less than 100 $\mu$m, and average intensities or irradiances of greater than 100 mW over the spot areas at repetition rates of greater than 200 Hz.

Lasers are described herein only by way of example to ultraviolet (UV) diode-pumped (DP) solid-state (SS) TEM$_{00}$ lasers that generate a natural Gaussian irradiance profile 10 such as shown in FIG. 1, but the description is germane to almost any laser generating Gaussian output. Ablating particular materials with any laser, and particularly a UV DPSS laser, is contingent upon delivering to a workpiece a fluence or energy density (typically measured in units of J/cm$^2$) above the ablation threshold of the target material. The laser spot of a raw Gaussian beam can be made quite small (typically on the order of 10 to 15 $\mu$m at the 1/e$^2$ diameter points) by focusing it with an objective lens. Consequently the fluence of the small focused spot easily exceeds the ablation threshold for common electronic packaging materials, particularly the copper typically used in the metallic conductor layers. Hence, the UV DPSS laser, when used in a raw, focused beam configuration, is an excellent solution for drilling vias through one or more copper layers in an electronic packaging workpiece. Since the focused spot is typically smaller than the desired size of the via, the focused spot is moved in a spiral, concentric circular, or "trepan" pattern to remove sufficient material to obtain the desired via size. This approach is commonly referred to as spiraling or trepanning with the raw, focused beam. Spiraling, trepanning, and concentric circle processing may generically be referred to as "nonpunching" for convenience.

An alternative approach that is also well known in the art involves passing the TEM$_{00}$ laser beam with the Gaussian irradiance profile through a circular aperture or mask of a predetermined diameter 12. One or more common refractive optic lenses are then used to project an image of the illuminated aperture onto the work surface. The size of the imaged circular spot depends on both the size of the aperture and optical de-magnification obtained with the refractive imaging lens or lenses. This technique, known as projection imaging or simply imaging, obtains a desired via diameter by adjusting either the aperture size or the optical de-magnification or both, until the size of the imaged spot matches the desired via size. Because the low-intensity "wings" of the Gaussian irradiance profile are masked or clipped by the aperture edges, this imaging technique is, therefore, also called clipped-Gaussian imaging.

When drilling vias with the imaged spot, the laser beam simply dwells at the via site for a number of pulses until sufficient material has been removed. This drilling method, often called "punching," eliminates the extremely precise and fast in-via movement of the laser spot that is required when trepanning or spiraling with the raw, focused beam. Thus, via drilling with a clipped Gaussian beam reduces the demands placed upon the high-speed beam positioner, since it eliminates the complex small-radius, curved pathways and attendant high accelerations associated with inside-the-via motions. Process development is also simpler with projection imaging because there are fewer process parameters to be optimized.

Clipped Gaussian processing also produces much rounder and more repeatable vias because the inherent variations in laser spot roundness from laser to laser no longer govern the shape of the via, rather the roundness is largely determined by the circularity of the aperture and the quality of the optics used to project its image onto the work surface. Roundness is also secondarily impacted by throughput and the degree to which the wings of the raw Gaussian pulse is clipped. Roundness, or circularity, may be quantified as a ratio of minimum diameter to the maximum diameter typically measured at the top of the via, i.e. R=d$_{min}$/d$_{max}$. The rounder spots are possible because only the central portion of the Gaussian irradiance profile of the laser beam is permitted to pass through the aperture; hence the low-irradiance outer regions of the Gaussian beam are blocked or clipped by the aperture mask.

A problem with a clipped Gaussian beam is, however, that its center is more brightly illuminated than its edges. This nonuniformity adversely affects the quality of vias created with this beam, particularly blind vias, resulting in vias having rounded bottoms and uneven edges and risking damage to the underlying or neighboring substrate.

A laser system employing the clipped Gaussian technique can be implemented so that varying fractions of the Gaussian beam are blocked by the aperture. If the Gaussian irradiance profile is highly clipped so that only a small portion of the output beam center is allowed to pass through the aperture, then the irradiance profile imaged onto the work surface will be more nearly uniform. This uniformity comes at the expense of rejecting a large fraction of the energy at the aperture mask and hence not delivering the energy to the work surface. Wasting such large portions of beam energy impedes drilling speed.

If, on the other hand, a large fraction of the beam energy is permitted to pass through the aperture, then higher fluence is delivered to the work. However, the difference between the irradiance at the spot center, I$_c$, and the spot edges, I$_e$, will be large. The fraction of energy passing through the aperture is commonly known as the transmission level, T. For a Gaussian beam, the following mathematical relationship exists:

$$T = 1 - I_e/I_c$$

For example, if 70% of the beam energy passes through the aperture, then both the irradiance and the fluence at the edge of the imaged spot will be only 30% of the value at the center of the spot. This difference between I$_c$ and I$_e$ causes tradeoffs in the drilling process.

If high laser power is used in order to drill more rapidly, the fluence at the spot center, F$_c$, can exceed the fluence at which the copper at the via bottom begins to melt and reflow. At the same time, if T is large (and therefore the edge-to-center fluence ratio $F_e/F_c$ within the spot is small), the edges of the imaged spot have low fluence and do not ablate the organic dielectric material rapidly. FIG. 2 is graph of edge fluence versus aperture diameter for clipped Gaussian output under typical via processing parameters. As a result, many pulses are required to clear the dielectric material (such as an epoxy resin) from the edges of the via bottom and thereby obtain the desired diameter at the via bottom. Applying these pulses, however, may damage the center of the via due to the high fluence in that region which melts the bottom copper.

The clipped Gaussian technique, therefore, forces a trade-off between high pulse energy that drills rapidly but damages the center of the via bottom and lower pulse energy that is below the copper reflow threshold fluence but drills slowly and requires many pulses to clear the via edges. Typically, depending on the via size, transmission levels between 30% and 60% offer an acceptable compromise between wasted (blocked) laser energy and the undesirable process phenomena related to non-uniformity of the fluence within the imaged spot. Small vias can be drilled at acceptable speed with lower transmission levels (e.g. 25–30%) and therefore higher uniformity of the imaged spot. However, for many applications, 50%<T<60% is desirable to obtain acceptable speed, and via quality suffers due to bottom copper damage.

A more energy and speed efficient method for drilling vias is therefore desirable.

SUMMARY OF THE INVENTION

An object of the present invention is, therefore, to provide a method and/or system that improves the speed or efficiency of via drilling with a Gaussian beam while improving the via quality.

Another object of the invention is to provide such a method or system that employs a UV, diode-pumped (DP), solid-state (SS) laser.

The present invention enhances the projection imaging technique. In one embodiment of the invention, a UV DPSS laser system is equipped with a diffractive optical element (DOE) to shape the raw laser Gaussian irradiance profile into a "top hat" or predominantly substantially uniform irradiance profile. The resulting shaped laser output is then clipped by an aperture or mask to provide an imaged shaped output beam. The imaged shaped output beam has a substantially uniform intensity laser spot from its center to its edge so that high quality vias can be drilled rapidly without risk of bottom damage.

Conventional systems that utilize beam shaping, projection imaging, or diffractive optics employ low brightness non-UV lasers or highly astigmatic and multi-mode Excimer lasers and have been generally used in applications other than materials processing.

In many of these beam shaping applications seeking to obtain near-uniform irradiance, the spatial uniformity is required to make the process work. Without it, the non-uniformity of the fluence at the work surface leads to similar problems with over-processing in the center of the focused or imaged spot and under-processing at its edges. In the present invention, the beam shaping does not enable the via drilling process. Rather, it enhances it by making the process faster and more controllable. The invention therefore provides the ability to enhance the quality, speed, and robustness of the UV laser via drilling process.

Although other types of devices have been used to produce near-uniform or "homogenized" beams with excimer lasers for materials processing, such homogenizers do not work with the highly coherent, near-$TEM_{00}$ spatial mode of a DPSS high-brightness laser. Further, since unlike the large spots inherent to an excimer laser beam, the $TEM_{00}$ spatial mode is highly focusable, so the present invention can utilize a much higher percentage of the incident energy.

Additional objects and advantages of this invention will be apparent from the following detailed description of preferred embodiments thereof which proceeds with reference to the accompanying drawings.

BRIEF DESCRIPTION OF THE DRAWINGS

FIGS. 5A–5C is a sequence of simplified irradiance profiles of a laser beam as it changes through various system components of the laser system of FIG. 4.

DETAILED DESCRIPTION OF PREFERRED EMBODIMENT

Figure 1:
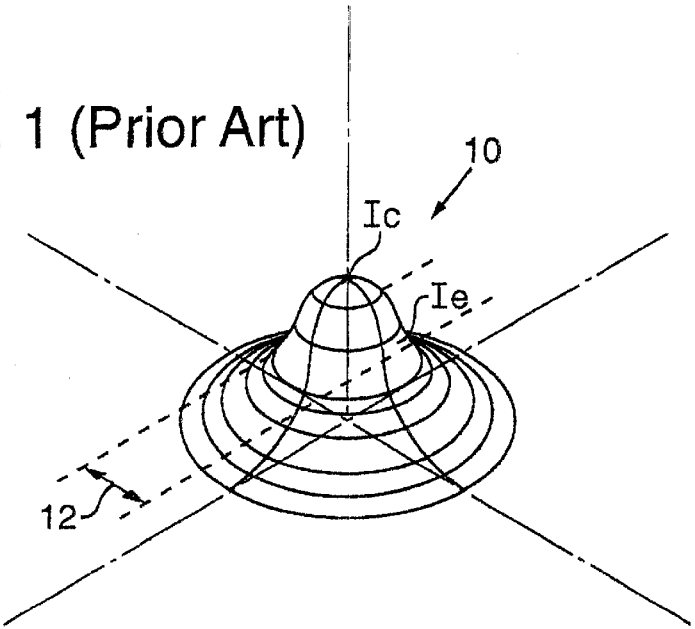
FIG. 1 is a perspective view of a three-dimensional Gaussian irradiance profile of a typical prior art DPSS laser pulse.
Figure 3:
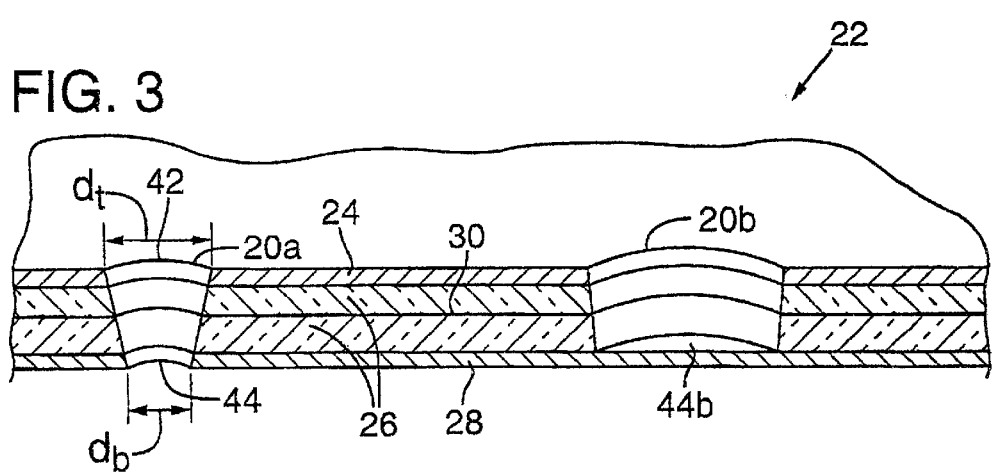
FIG. 3 is an enlarged, cross-sectional side view of vias drilled into a portion of a generic laser workpiece.
Figure 2:
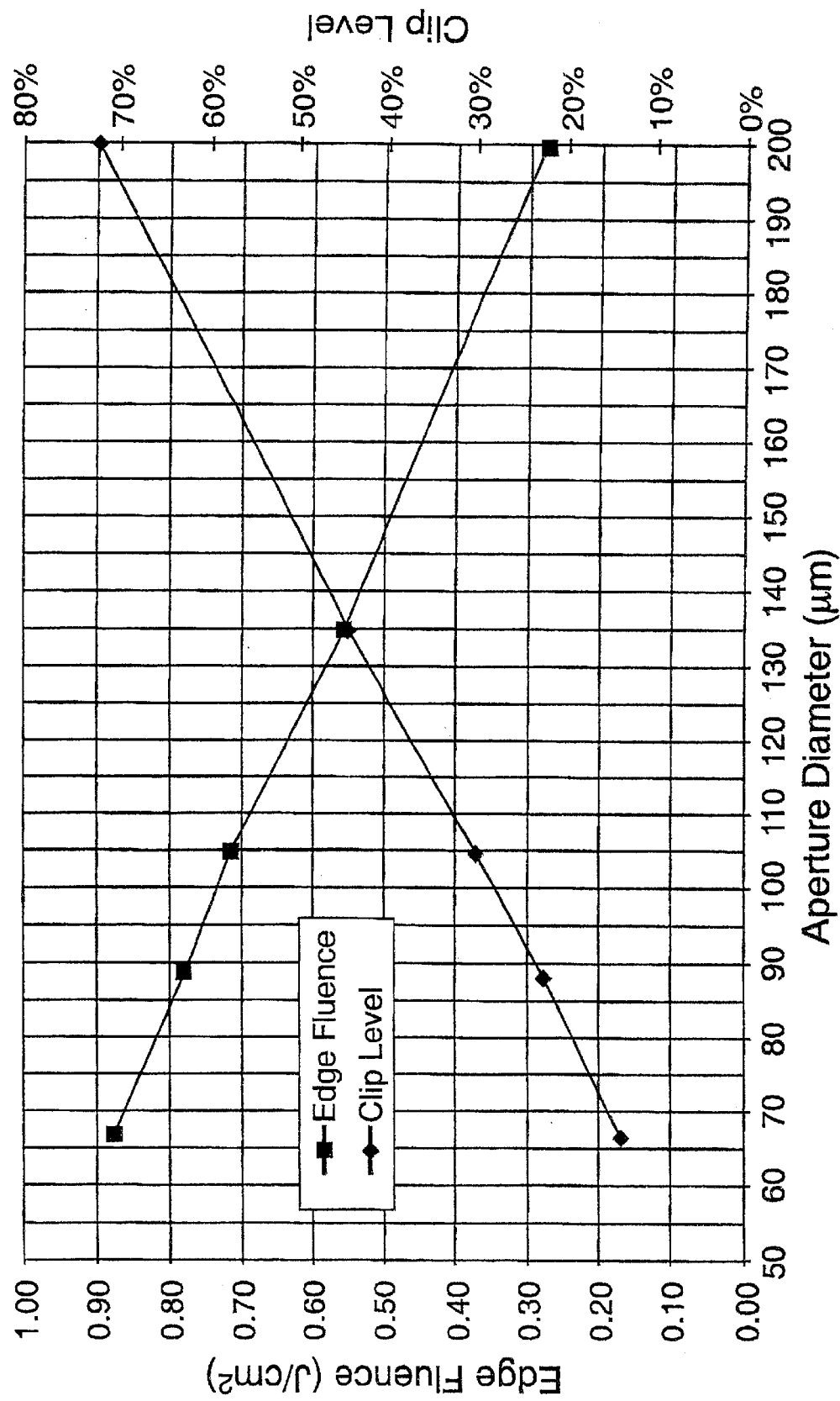
FIG. 2 is graph of edge fluence versus aperture diameter for clipped Gaussian output under typical via processing parameters.

FIG. 3 is an enlarged, cross-sectional side view of though hole via 20a and blind via 20b (generically via 20) machined into a generic laser workpiece 22 that may, for example, be an MCM, circuit board, or semiconductor microcircuit package. For convenience, workpiece 22 is depicted as having only four layers 24, 26, 28, and 30.

Layers 24 and 28 may contain, for example, standard metals such as, aluminum, copper, gold, molybdenum, nickel, palladium, platinum, silver, titanium, tungsten, metal nitrides, or combinations thereof. Conventional metal layers 24 and 28 vary in thickness, which is typically between 9–36 $\mu$m, but they may be thinner or as thick as 72 $\mu$m.

Layer 26 may, for example, contain a standard organic dielectric material such as benzocyclobutane (BCB), bismaleimide triazine (BT), cardboard, cyanate esters, epoxies, phenolics, polyimides, polytetrafluorethylene (PTFE), various polymer alloys, or combinations thereof. Conventional organic dielectric layers 26 vary considerably in thickness, but are typically much thicker than metal layers 24 and 28. An exemplary thickness range for organic dielectric layers 26 is about 30–400 $\mu$m, but they may be placed in stacks as large as 1.6 mm.

Layer 26 may also contain a standard reinforcement component or "layer" 30. Layer 30 may be fiber matte or dispersed particles of, for example, aramid fibers, ceramics, or glass woven or dispersed into organic dielectric layer 26. Conventional reinforcement layers 30 are typically much thinner than organic dielectric layers 26 and may be on the order of 1–2 $\mu$m and perhaps up to 10 $\mu$m. Skilled persons will appreciate that reinforcement material may be introduced as powders into the organic dielectrics. The layers 30 formed by such powdery reinforcement material may be noncontiguous and nonuniform. Skilled persons will also appreciate that layers 24, 26, and 28 may also be internally noncontiguous, nonuniform, and nonlevel. Stacks having several layers of metal, dielectric, and reinforcement material may be larger than 2 mm.

A through-hole via 20a typically penetrates all layers and materials of workpiece 22 from its top 42 to its bottom 44. Blind via 20b does not penetrate all layers and/or materials. In FIG. 3 for example, blind via 20b stops at and does not penetrate layer 28. The taper of a via 20 is commonly discussed in terms of a ratio of its bottom diameter $d_b$ to its top diameter $d_t$. A taper ratio of 66% is currently an acceptable standard in the industry, and ratios of 67–75% are considered to be very good. The present invention permits a taper ratio of greater than 80% at a maximum throughput with no damage to layer 28, and taper ratios of greater than 95% are possible without damage to layer 28.

Via diameters typically range from 25–300 $\mu$m, but laser system 50 (FIG. 4) may produce vias 20a and 20b that are as small as about 5–25 $\mu$m or greater than 1 mm. Vias smaller than 150 $\mu$m diameter are preferably produced by laser punching. Vias larger than 180 $\mu$m are preferably produced by trepanning, concentric circle processing, or spiral processing.

Figure 4:
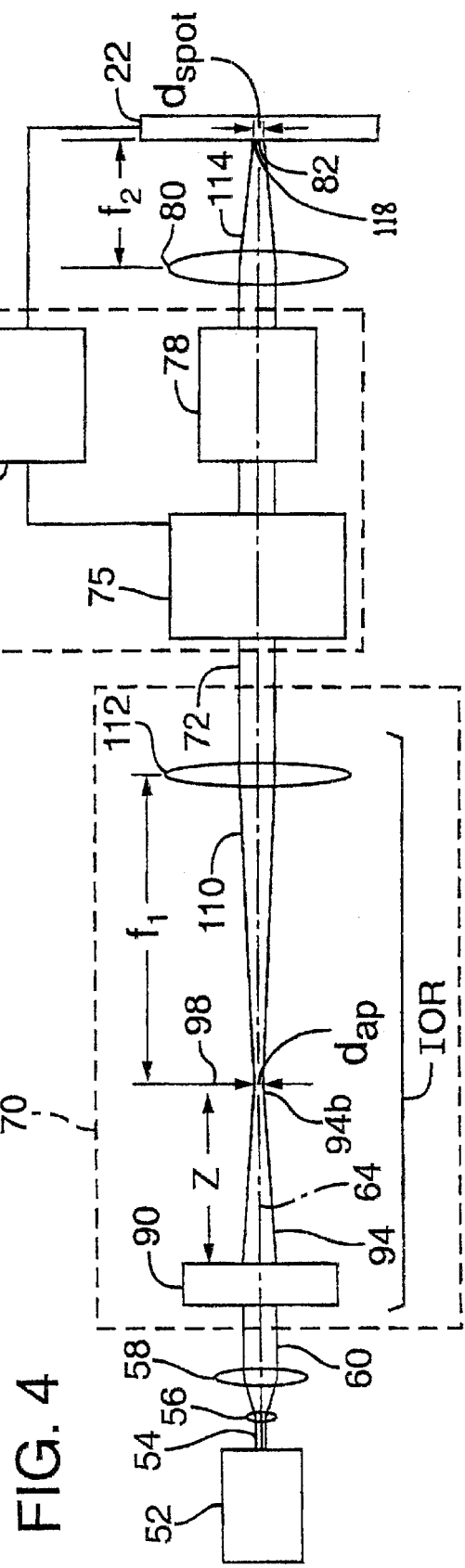
FIG. 4 is a simplified side elevation and partly schematic view of an embodiment of a laser system employed for increasing via drilling throughput in accordance with the present invention.

With reference to FIG. 4, a preferred embodiment of a laser system 50 of the present invention includes Q-switched, diode-pumped (DP), solid-state (SS) UV laser 52 that preferably includes a solid-state lasant such as Nd:YAG, Nd:YLF, Nd:YAP, or Nd:YVO$_4$, or a YAG crystal doped with holmium or erbium. Laser 52 preferably provides harmonically generated UV laser pulses or output 54 at a wavelength such as 355 nm (frequency tripled Nd:YAG), 266 nm (frequency quadrupled Nd:YAG), or 213 nm (frequency quintupled Nd:YAG) with primarily a TEM$_{00}$ spatial mode profile.

Although Gaussian is used to describe the irradiance profile of laser output 54, skilled persons will appreciate that most lasers 52 do not emit perfect Gaussian output 54 having a value of $M^2=1$. For convenience, the term Gaussian is used herein to include profiles where $M^2$ is less than or equal to about 1.4, even though $M^2$ values of less than 1.3 or 1.2 are preferred. Skilled persons will appreciate that other wavelengths are available from the other listed lasants. Laser cavity arrangements, harmonic generation, and Q-switch operation are all well known to persons skilled in the art. Details of one exemplary laser 52 are described in detail in U.S. Pat. No. 5,593,606 of Owen et al.

UV laser pulses 54 may be converted to expanded collimated pulses or output 60 by a variety of well-known optics including beam expander or upcollimator lens components 56 and 58 (with, for example, a 2× beam expansion factor) that are positioned along beam path 64. Collimated pulses 60 are directed through a shaping and imaging system 70 to produce collimated apertured shaped pulses or output 72 that is then preferably directed by a beam positioning system 74 to target collimated apertured shaped output 72 through a scan lens 80 (The scan lens is also referred to as a "second imaging," focusing, cutting, or objective lens.) to a desired laser target position 82 at the image plane on workpiece 22.

Beam positioning system 74 preferably includes a translation stage positioner 76 and a fast positioner 78. Translation stage positioner 76 employs includes at least two platforms or stages that supports, for example, X, Y, and Z positioning mirrors and permits quick movement between target positions 82 on the same or different circuit boards or chip packages. In a preferred embodiment, translation stage positioner 76 is a split-axis system where a Y stage supports and moves workpiece 22, an X stage supports and moves fast positioner 78 and objective lens 80, the Z dimension between the X and Y stages is adjustable, and fold mirrors 75 align the beam path 64 through any turns between laser 52 and fast positioner 78. Fast positioner 78 may for example include a pair of galvanometer mirrors that can effect unique or duplicative processing operations based on provided test or design data. These positioners can be moved independently or coordinated to move together in response to panelized or unpanelized data. Such a preferred beam positioning system 74 that can be used for drilling vias 20 is described in detail in U.S. Pat. No. 5,751,585 of Cutler et al.

A laser controller (not shown) that directs the movement of the beam positioning components preferably synchronizes the firing of laser 52 to the motion of the components of beam positioning system 74 such as described in U.S. Pat. No. 5,453,594 of Konecny for Radiation Beam Position and Emission Coordination System.

An example of a preferred laser system 50 that contains many of the above-described system components employs a Model 45xx UV laser (355 nm) in a Model 5200 laser system or others in its series manufactured by Electro Scientific Industries, Inc. in Portland, Oreg. Persons skilled in the art will appreciate, however, that any other laser type having a Gaussian beam intensity profile, other wavelengths such as IR, or other beam expansion factors can be employed.

FIGS. 5A–5C (collectively FIG. 5) show a sequence of simplified irradiance profiles 92, 96, and 102 of a laser beam as it changes through various system components of laser system 50. FIGS. 5Ba–5Bc show simplified irradiance profiles 96a–96c of shaped output 94 (94a, 94b, and 94c, respectively) as a function of distance Z with respect to $Z_0'$. $Z_0'$ is the distance where shaped output 94 has its flattest irradiance profile shown in irradiance profile 96b.

With reference again to FIGS. 4 and 5, a preferred embodiment of shaped imaging system 70 includes one or more beam shaping components 90 that convert collimated pulses 60 that have a raw Gaussian irradiance profile 92 into shaped (and focused) pulses or output 94b that have a near-uniform "top hat" profile 96b, or particularly a super-Gaussian irradiance profile, in proximity to an aperture mask 98 downstream of beam shaping component 90. FIG. 5Ba shows an exemplary irradiance profile 96a where $Z<Z_0'$, and FIG. 5Bc shows an exemplary irradiance profile 96c where $Z>Z_0'$.

Beam shaping component 90 is preferably a diffractive optic element (DOE) that can perform complex beam shaping with high efficiency and accuracy. Beam shaping component 90 not only transforms the Gaussian irradiance profile of FIG. 5A to the near-uniform irradiance profile of FIG. 5Bb, but they also focus the shaped output 94 to a determinable or specified spot size. Both the shaped irradiance profile 94b and the prescribed spot size are designed to occur at a design distance $Z_0$ down stream of beam shaping component 90. In a preferred embodiment, $Z_0'$ is close to or equal to distance $Z_0$. Although a single element DOE is preferred, skilled persons will appreciate that the DOE may include multiple separate elements such as the phase plate and transform elements disclosed in U.S. Pat. No. 5,864,430 of Dickey et al., which also discloses techniques for designing DOEs for the purpose of beam shaping. Suitable DOEs can be manufactured by MEMS Optical, Inc., Huntsville, Ala.

Figure 6A:
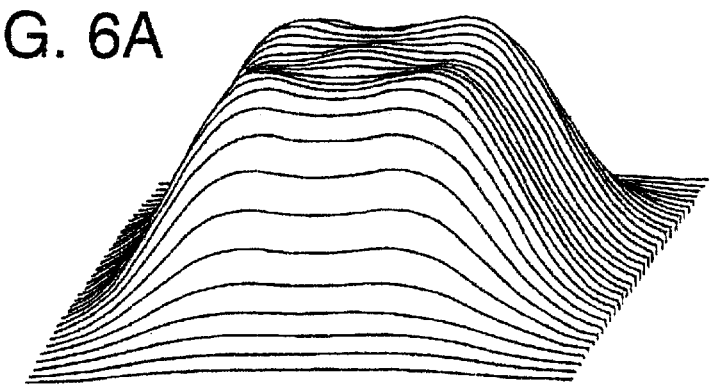
FIGS. 6A–6D are exemplary substantially uniform square or circular irradiance profiles.
Figure 6B:
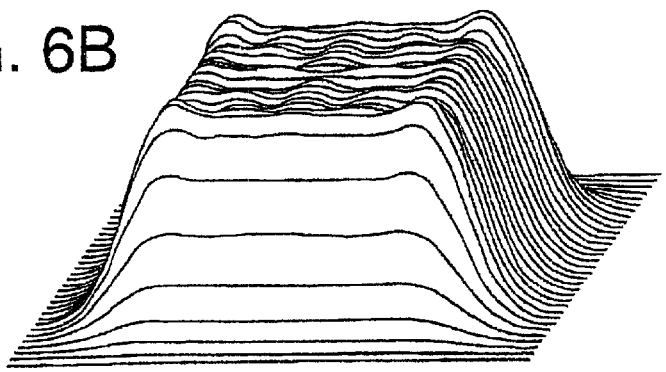
Figure 6C:
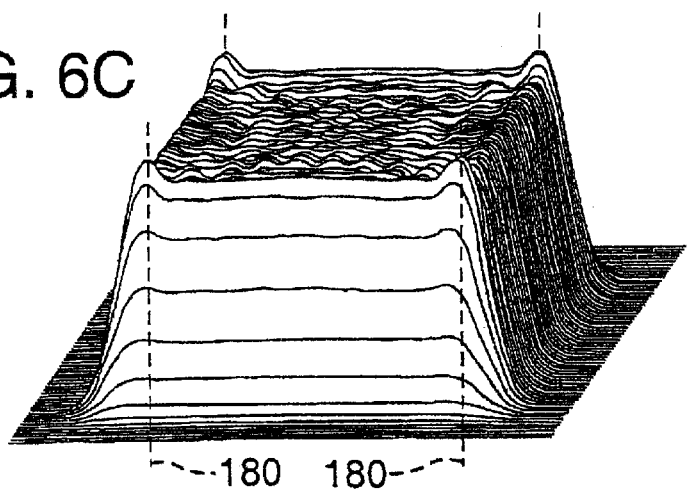
Figure 6D:
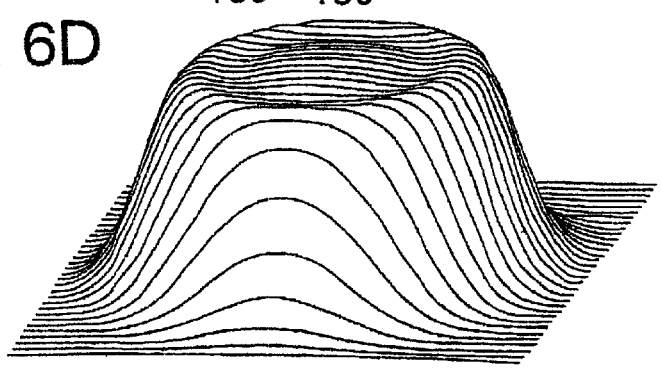

FIGS. 6A–6D (collectively FIG. 6) show exemplary substantially uniform irradiance profiles produced by a Gaussian beam propagating through a DOE as described in U.S. Pat. No. 5,864,430. FIGS. 6A–6C show square irradiance profiles, and FIG. 6D shows a cylindrical irradiance profile. The irradiance profile of FIG. 6C is "inverted," showing higher intensity at its edges than toward its center. Skilled persons will appreciate that beam shaping components 90 can be designed to supply a variety of other irradiance profiles that might be useful for specific applications, and these irradiance profiles typically change as a function of their distance from $Z_0'$. Skilled persons will appreciate that a cylindrical irradiance profile such as shown in FIG. 6D is preferably employed for circular apertures 98; cuboidal irradiance profiles would be preferred for square apertures; and the properties of other beam shaping components 90 could be tailored to the shapes of other apertures. For many straight forward via drilling applications, an inverted cylindrical irradiance profile would be preferred.

With reference again to FIGS. 4–6, shaped pulses 94 are preferably focused and passed through an aperture mask 98 to sharpen the edge of shaped pulses 94. In a preferred embodiment, aperture 98 is positioned at the "nominal aperture plane" which is preferably located at a distance Z from beam shaping component 90 about where $Z=Z_0$, $Z^*$, or $Z_0$. $Z^*$ is about the distance that permits a specified desired amount of energy of shaped pulse 94 through an aperture 98 of a given desirable diameter $d_{ap}$. Skilled persons will appreciate that in an ideal system, $Z_0=Z_0'=Z^*$.

While positioning aperture 98 at distance $Z_0$ would be preferred for most applications on a single laser system 50, positioning aperture 98 at distance $Z^*$ is employed for groups of laser systems 50 to address output variations from laser 52 to laser 52 and beam shaping element 90 to beam shaping element 90. $Z^*$ is preferred because $Z^*$ is more sensitive than $Z_0'$ such that adjustment within the tolerance of distance $Z^*$ will not generally deviate the flatness of irradiance profile 96b to the extent that it significantly adversely affects via quality or throughput. An advantage of using distance $Z^*$ for placement of the aperture is that $Z^*$ permits a variety of laser systems 50 having variations in Gaussian output 54 from lasers 52 to employ the same process parameters from laser system 52 to laser system 52 for the same operations. Thus, employing $Z^*$ facilitates consistency in documentation, training, synchronization, and via quality.

Mask 98 may comprise a UV reflective or UV absorptive material, but is preferably made from a dielectric material such as UV grade fused silica or sapphire coated with a multilayer highly UV reflective coating other UV resistant coating. Mask 98 has a circular aperture with a diameter of $d_{ap}$ to produce a highly circular imaged shaped pulses 110. The aperture of mask 98 may optionally be flared outwardly at its light exiting side. Skilled persons will appreciate, however, that aperture of mask 98 can be square, have other noncircular shapes, or even be omitted if images of non-circular spots on the surface of workpiece 22 are desirable or acceptable. Diameter of $d_{ap}$ clips the wings 100 of shaped pulses 94 to produce an apertured shaped profile 102 that decreases the diameter of shaped pulses 94 at the expense of their transmitted energy.

The transmitted apertured shaped pulse or output 110 is then collected by a "first imaging" or collection lens 112 of focal length $f_1$ to produce collimated apertured shaped output 72 that is propagated through positioning system 74 and then re-imaged by scan lens 80 of focal length $f_2$ to produce (targeted apertured shaped) laser system pulses or output 114 directed toward workpiece 22, and creating imaged shaped output 118 of spot size diameter $d_{spot}$ on workpiece 22. In a preferred embodiment, lenses 112 and 80 comprise the imaging optics useful for inhibiting diffraction rings; however, a skilled person will appreciate that a single imaging lens component could be employed. In a preferred embodiment, $f_1=216$ mm and $f_2=81$ mm, though persons skilled in the art will recognize that other lens combinations and focus lengths could be substituted. The combination of the collection lens 112 and the scan lens 80 produces an image of the uniformly illuminated aperture of mask 98 (or uniform-irradiance non-circular spot if mask 98 is not used) at a de-magnification factor M, where $M=f_1/f_2=d_{ap}/d_{spot}$. In a preferred embodiment of a fixed de-magnification system, $M=2.66$, although skilled person will appreciate that other de-magnification factors could be used.

In a preferred embodiment, beam shaping component 90, aperture mask 98, and first imaging lens 112 are mounted on an interchangeable imaging optics rail (IOR). In one embodiment, the distance Z, $f_1$, and $f_2$ are conserved to permit manufacturing interchangeability of these components in the IOR with analogous components with different properties to perform diverse ranges of spot sizes $d_{spot}$. The positioning of beam shaping component 90 can also be variable so that distance Z can be adjusted within the tolerances of $Z^*$ for each combination of beam shaping components 90 and aperture diameters $d_{ap}$. The effective distance between lenses 112 and 80 is variable. Thus, several IORs with different combinations of IOR components can be quickly exchanged to allow processing operations for a diverse range of predetermined spot sizes. These different combinations are employed so the beam shape or irradiance profile 96 can be adapted for each aperture size $d_{ap}$ to maximize the energy per pulse 62 that propagates through the aperture and therefore minimize the energy clipped or wasted by the size limit of the aperture. In addition, to enhancing the efficient use of the pulse energy, the adjustable coordination between the IOR optical components minimizes any mask 98 adaptations that might be desirable to make mask 98 able to withstand laser damage.

A disadvantage of this embodiment is, however, the large number of interchangeable IOR optical components desirable for processing a range of useful spot sizes. For example, each beam shaping component 90 may, for example, be efficient for only three to four spot sizes $d_{spot}$, and each mask 98 may, for example, be efficient for only one spot size $d_{spot}$. Thus, to cover the most useful range of spot sizes $d_{spot}$ up to 250 μm, for example, a collection of eight beam shaping components 90 and 25 masks 98 might be employed to provide all of the desirable combinations.

Figure 7A:
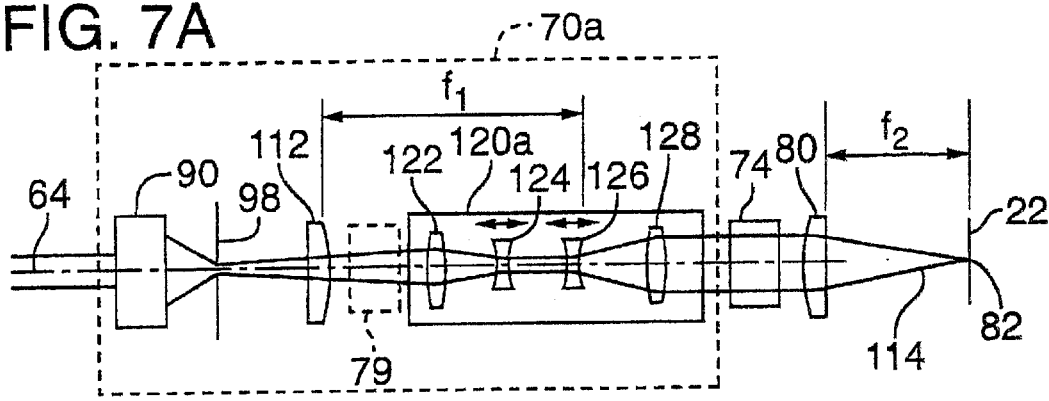
FIGS. 7A–7D are simplified side elevation and partly schematic views of three respective exemplary embodiments of beam shaping systems for varying the size of an image spot.

FIGS. 7A–7D are simplified side elevation and partly schematic views of four respective exemplary embodiments of shaped imaging systems 70a, 70b, 70c, and 70d (generically, shaped imaging system 70) for varying the size of an imaged spot. With reference to FIGS. 4 and 7A, a zoom lens or variable beam expander 120a (with tight tolerances to maintain beam accuracy) is positioned along beam path 64 between first imaging lens 112 and scan lens 80. In these embodiments, the focal length $f_2$ is fixed, but the focal length $f_1$ is variable and therefore the de-magnification factor, M, and the spot size $d_{spot}$ are variable, so each beam shaping component 90 may for example efficiently accommodate 8–10 spot sizes and each aperture may also efficiently accommodate 8–10 spot sizes. Thus, to cover the range of spot sizes $d_{spot}$ up to about 250 μm, only a few beam shaping components 90 and masks 98 would be employed. These embodiments may employ optional alignment mirrors 79 shown in phantom.

Figure 7B:
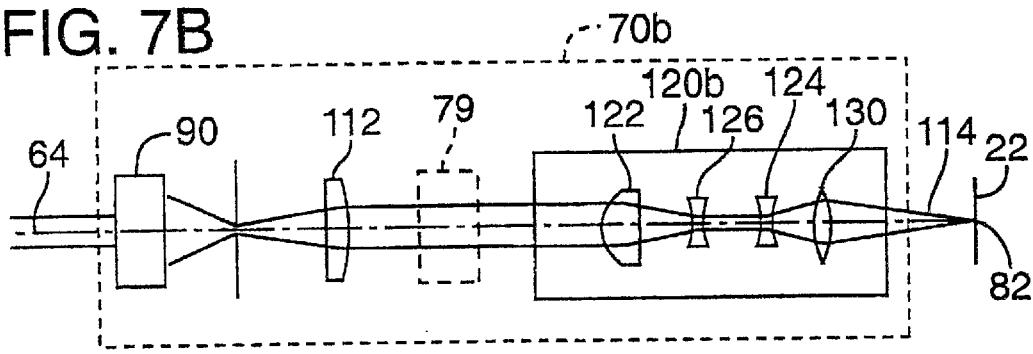
Figure 7C:
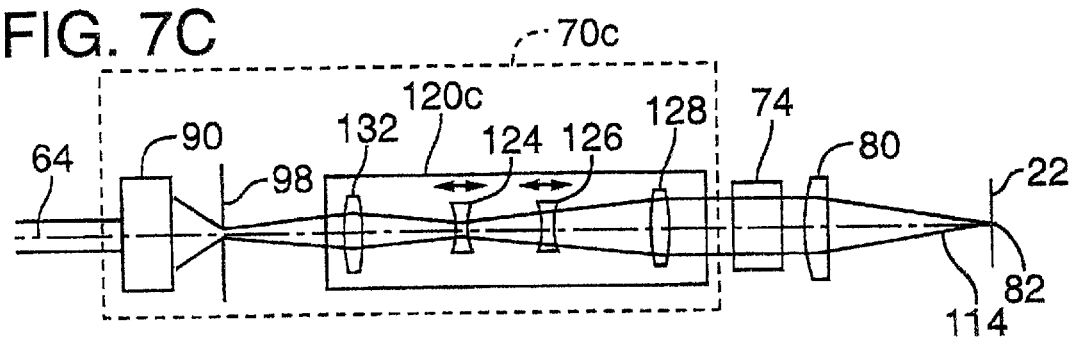
Figure 7D:
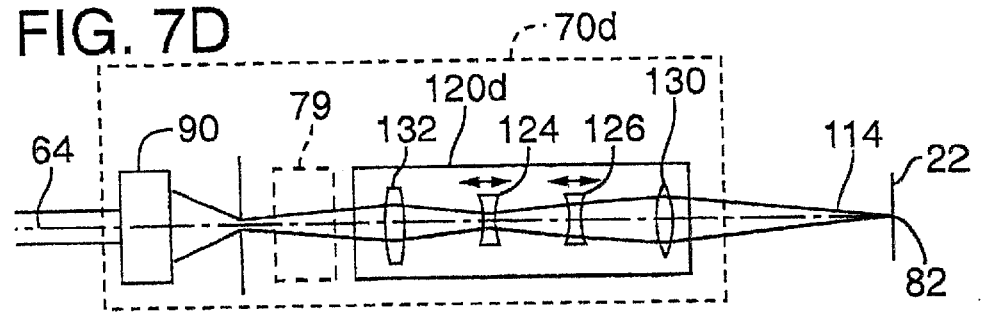

In zoom lens assembly 120b of the embodiment of shaped imaging system 70b shown in FIG. 7B, lens 80 and lens 128 are combined into a single lens 130 in zoom lens assembly 120b. In zoom lens assembly 120c of the embodiment of shaped imaging system 70c shown in FIG. 7C, lens 112 and lens 122 are combined into a single lens 132 in zoom lens assembly 120c. In zoom lens assembly 120d of the embodiment of shaped imaging system 70d shown in FIG. 7D, lens 80 and lens 128 are combined into a single lens 130 and lens 112 and lens 122 are combined into a single lens 132. Skilled persons will appreciate that shaped imaging systems 70a and 70c are best suited for a preferred split-axis translation stage positioner 76, and that shaped imaging systems 70b and 70d are best suited for beam positioning systems 74 that do not have a fast positioner 78 such as non-scanning systems that employ a fixed objective lens 80. Skilled persons will further appreciate that numerous other variable lens combinations are possible and could be employed without departing from the scope of the invention.

Although positioning system 74 is shown following zoom lens assembly 120 along beam path 64, some of its components may be positioned to precede zoom lens assembly 120. For example, some components of translation stage positioner may be positioned upstream of zoom lens assembly 120, such as some of mirrors 75; however, fast positioner 78 is preferably positioned downstream of lens assembly 120. Skilled persons will appreciate that these shaped imaging systems 70 may be supported by separate IORs or a single IOR system that permits exchange and repositioning of the optical components and that the IORs supporting the shaped imaging systems can be easily removed to permit laser system 50 to provide Gaussian output for versatility.

Figure 8:
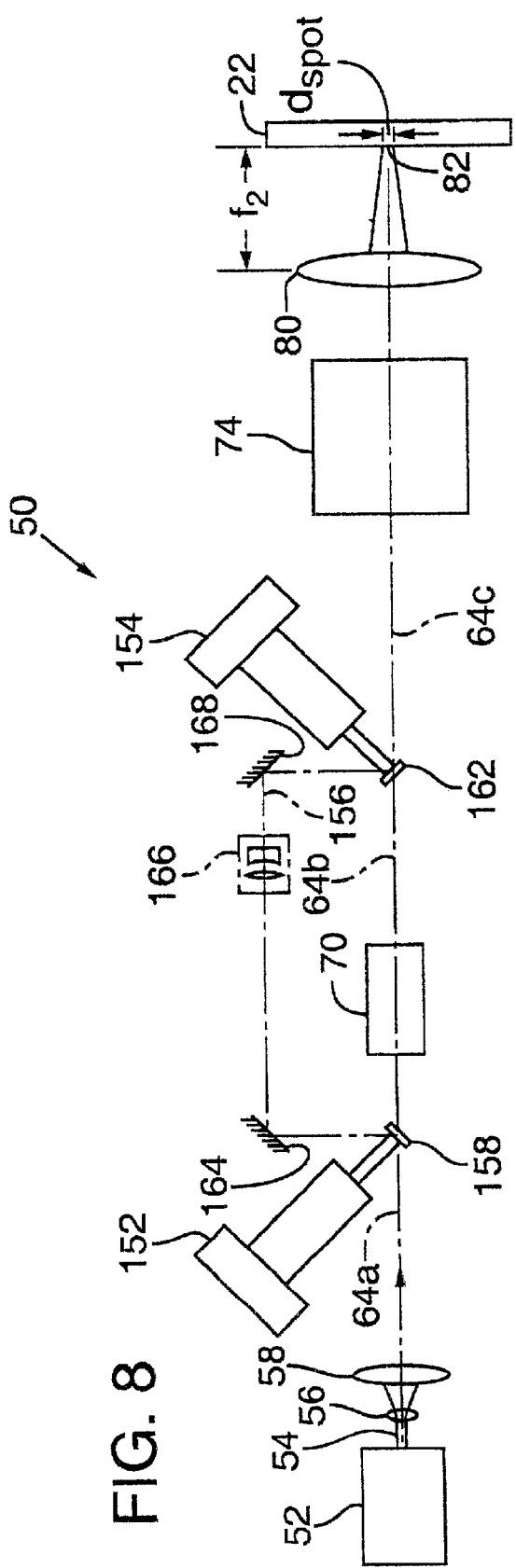
FIG. 8 is a simplified partly schematic plan view of alternative laser system that employs an auxiliary galvanometer mirror pathway to permit use of a raw focused beam.

FIG. 8 is a simplified partly schematic plan view of laser system 150 that employs galvanometers 152 and 154 to produce an auxiliary galvanometer mirror pathway 156 that can be added to laser system 50 of FIG. 4 to permit switching between collimated apertured shaped output 72 and Gaussian output 60. With reference to FIG. 8, beam path 64a is directed toward galvanometer mirror 158 that either permits the laser output to propagate along beam path 64b through shaped imaging system 70 and by galvanometer mirror 162 or reflects the laser output off mirror 164, through optional collimating lens components 166, off mirror 168, off galvanometer mirror 162, and toward workpiece 22. Mirrors 164 and 168 can preferably be adjusted to compensate for pitch and roll.

Skilled persons will appreciate that collimating lens components 166 can be variable to modify the spatial spot size $d_{spot}$ to suit different applications. Alternatively, for example, shaped imaging system 70 can instead be positioned along pathway 156 to implement collimated apertured shaped output 72 so the raw Gaussian beam 60 would propagate along beam path 64b. Similarly, a shaped imaging system 70 can be employed in both beam path 64b and pathway 156 with each shaped imaging system 70 having variable or different focal lengths to produce different spot sizes $d_{spot}$, such as for quick switching between two different imaged shaped spot sizes. Skilled persons will also appreciate that laser system 150 could employ the Gaussian output to perform a variety of tasks in addition to the via processing applications discussed herein. For example, laser system 150 could be used to cut circuits out of panels at high throughput rates.

Laser systems 50 and 150 are capable of producing laser system having output 114 having preferred parameters of typical via processing windows that may include average power densities greater than about 100 mW measured over the beam spot area, and preferably greater than 300 mW; spot size diameters or spatial major axes of about 5 μm to about 18 μm, preferably from about 25–150 μm, or greater than 300 μm; and a repetition rate of greater than about 1 kHz, preferably greater than about 5 kHz or even higher than 30 kHz; an ultraviolet wavelength, preferably between about 180–355 nm; and temporal pulse widths that are shorter than about 100 ns, and preferably from about 40–90 ns or shorter. The preferred parameters of laser system output 114 are selected in an attempt to circumvent thermal damage to via 20 or its surroundings. Skilled persons will also appreciate that the spot area of laser system output 114 is preferably circular, but other simple shapes such as squares and rectangles may be useful and even complex beam shapes are possible with the proper selection of beam shaping component 90 cooperating with a desirable aperture shape in mask 98.

The above-described processing window has been determined to facilitate via drilling in a wide variety of metallic, dielectric, and other target materials that exhibit diverse optical absorption and other characteristics in response to ultraviolet light. Whether punching or nonpunching to create blind vias 20b, the metal layer is removed with a first laser output having a power density sufficient to ablate the metal. Then, the dielectric layer is removed with a second laser output having a lower power density that is insufficient to ablate the metal, so only the dielectric is removed and the underlying metallic layer is not damaged. Thus, the two-step machining method provides a depthwise self-limiting blind via because the second laser power output is insufficient to vaporize the metallic bottom layer, even if the second laser power output continues after the dielectric material is completely penetrated.

Skilled persons will appreciate that in accordance with a punching process of the present invention, the first and second laser outputs are preferably sequentially contiguous rather than employing a series of first laser outputs one at a time to spatially separated target positions 82 or workpiece 22 and then employing a series of second laser outputs sequentially over the same targets 82. For a nonpunching process, layers 24 of all of the spatially separated target positions 82 on workpiece 22 may be processed with the first laser outputs before the layers 26 of all of the spatially separated target positions 82.

With reference again to FIGS. 3 and 4, one difference between the clipped Gaussian output of the prior art and imaged shaped output 118 of the present invention is that pulse 94 uniformly illuminates the aperture of mask 98 at all points. The imaged shaped output 118 consequently facilitates formation of blind vias 20*b* with a very flat and uniform bottom 44*b* at layer 28 in addition to a very round shape and crisp edges, and this flatness and uniformity are not possible with a clipped Gaussian beam. In addition, the drilling speed can be increased with imaged shaped output 118 over that obtainable with a clipped Gaussian beam.

The addition of a beam shaping component 90 to flatten the irradiance profile 10 of a Gaussian beam minimizes the previously discussed processing tradeoffs between via quality and drilling speed inherent to the clipped Gaussian technique. A high fraction of the beam energy can be delivered to workpiece 22 without a large difference in fluence between the center and edges of the imaged spot, i.e. the edge-to-center fluence ratio Fe/Fc can be increased while transmission level T is also increased. The present invention permits apertured shaped output 110 and imaged shaped output 118 to have transmission levels of 70–85% without a significant decrease in center to edge fluence ratio.

As a result of the near-uniform fluence at high transmission levels, the drilling speed can be increased without damaging conductor layer 28, particularly at its center, for two reasons. First, the transmission level through the aperture is higher than for the clipped Gaussian, so more energy is delivered to the workpiece 22 in each laser pulse 114. Second, since a higher fluence can be applied to the edges of the spot, the dielectric material can be cleared from the bottom edges of the via more rapidly. This second effect is the more significant of the two.

Figure 9:
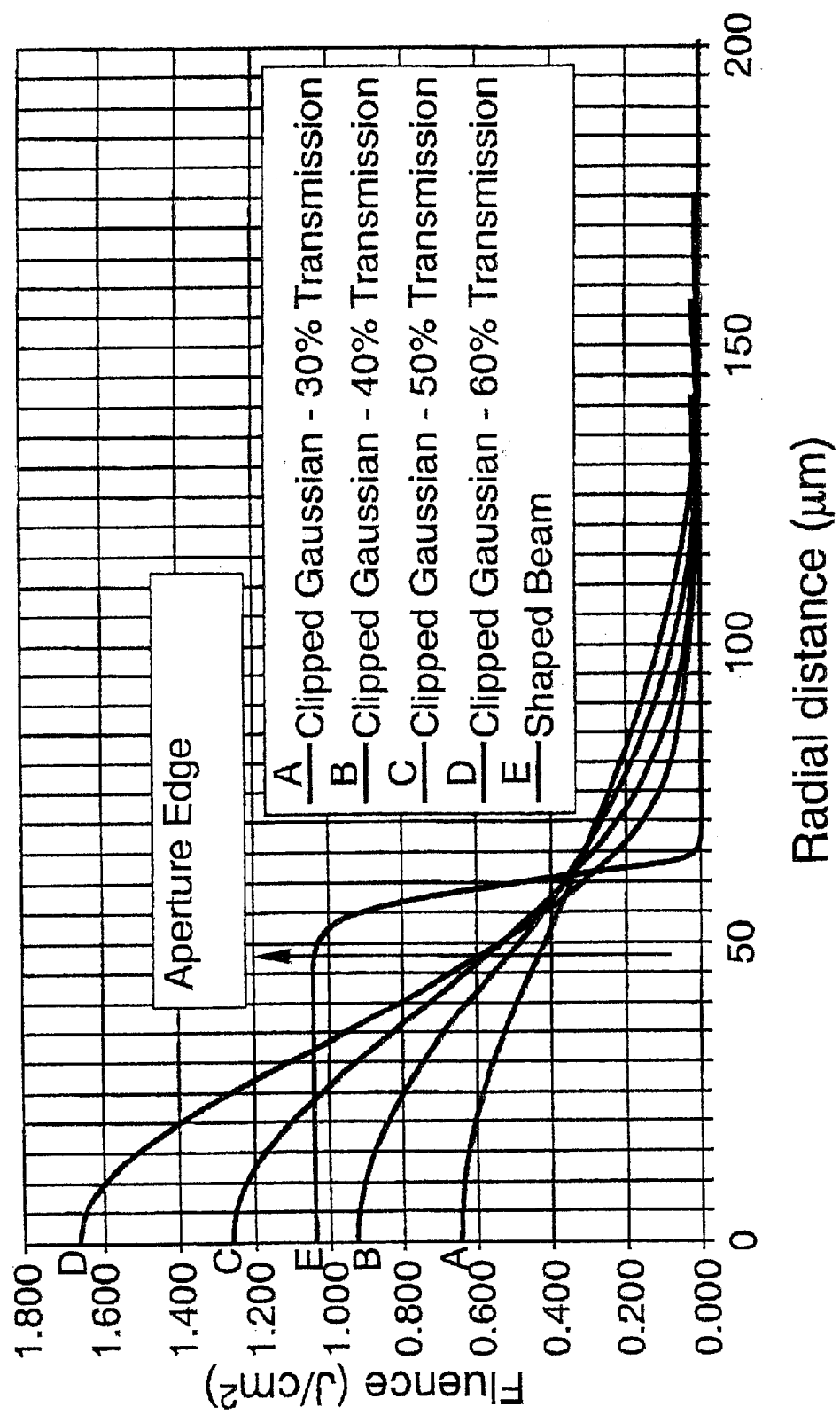
FIG. 9 is a graphical comparison of ideal fluence distributions at the aperture plane for imaged shaped output and clipped Gaussian output at several typical transmission levels under typical via processing parameters.

FIG. 9 shows a comparison of ideal fluence profiles at the aperture plane for shaped output 94*b* and clipped Gaussian output at several typical transmission levels under typical via processing parameters. Fluence levels on the workpiece 22 are equal to the aperture fluence levels multiplied by the imaging de-magnification factor squared, which in a preferred embodiment is about a factor of seven. The fluences at the aperture edge are about 1.05 J/cm$^2$ and 0.60 J/cm$^2$ or less for shaped output 94*b* and clipped Gaussian output, respectively. Thus, at workpiece 22, the fluences at the edge of the imaged spot are about 7.4 and 4.3 J/cm$^2$ for the imaged shaped output 118 and clipped Gaussian output, respectively. The rate at which a typical organic dielectric material of layer 26 can be ablated differs significantly between these two fluence levels. As a result, drilling of each via 20 can be completed in fewer pulses with the imaged shaped output 118, increasing the process throughput.

An example of a strategy for drilling vias 20 with imaged shaped output 118 in accordance with these considerations of present invention is described below. The fluence across the entire imaged spot can be maintained, for example, at 90% of the value at which copper damage occurs, $F_{damage}$. The dielectric material is then ablated at conditions which will not damage via bottom 44*b*. In contrast, with the clipped Gaussian beam at T=50%, one could maintain the center of the spot at this fluence, in which case the edges would be at only 45% of $F_{damage}$. Alternatively, the spot edge could be held at 90% of $F_{damage}$, in which case the center would be at 180% of the damage threshold fluence, resulting in substantial damage. Maintaining the edges of the imaged spot at high fluence enables the dielectric material to be cleared from the via edges with fewer laser pulses, since each pulse removes more material. Thus, the drilling throughput of imaged shaped output 118 can be much greater than that of the clipped Gaussian output.

Figure 10:
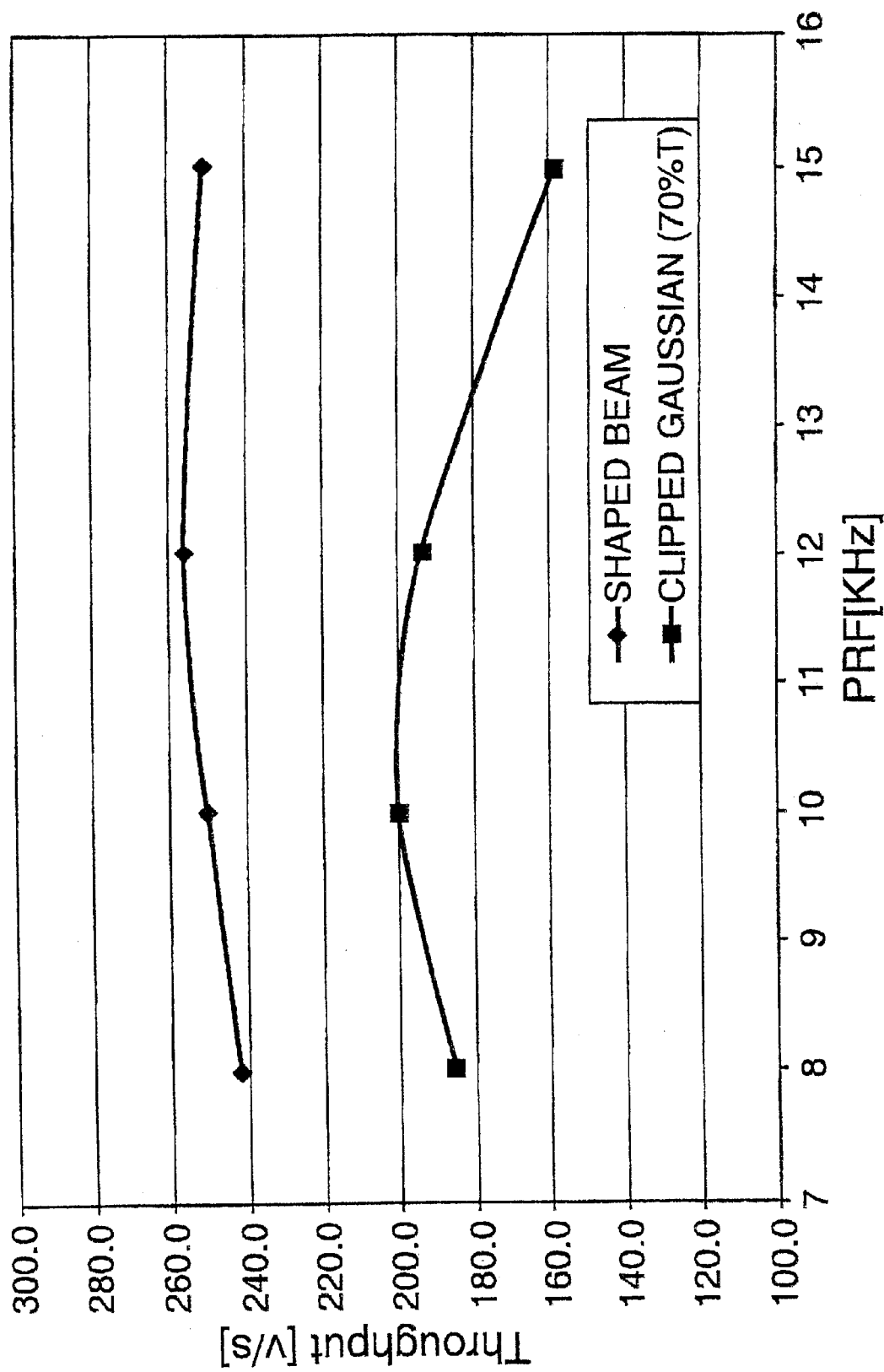
FIG. 10 is a graphical comparison of throughput curves for clipped Gaussian and imaged shaped via drilling techniques.

FIG. 10 shows a comparison of the throughput curves achieved by the imaged shaped output 118 and the clipped Gaussian output for punching 75 μm-diameter vias 20 in 45 μm-deep epoxy resin. With reference to FIG. 10, the minimum number of pulses, N, necessary to achieve a bottom diameter $d_b$ at least 75% as large as the top diameter $d_t$ at each pulse repetition frequency (PRF) was determined. The drilling time was calculated for this value of N at the PRF, and a 1.0 ms via-to-via move time was added to obtain the throughput.

In general, as the laser PRF increases, the energy in each pulse, and therefore the work-surface fluence, steadily decreases. Since decreased fluence means less material is removed per pulse, more pulses must be applied. However, as the PRF increases, more pulses are delivered per unit time. The net result is that of two competing effects, one of which tends to decrease drilling speed and the other of which tends to increase drilling speed with increasing PRF. FIG. 10 shows that the competing effects yield the fastest throughputs at PRFs in the middle of the range tested.

FIG. 10 also shows that the throughput curve achieved with imaged shaped output 118 is flatter than that obtained with clipped Gaussian output. The flatter throughput curve is significant for managing the tradeoff between drilling speed and via quality. In order to avoid damage to the bottom metallic layer 28, it is generally desirable to increase the laser PRF, thereby decreasing the energy in each pulse and reducing the work-surface fluence below the energy threshold for melting metallic layer 28. As the PRF is increased, the throughput obtained with the imaged shaped output 118 decreases more slowly than that of the clipped Gaussian output. So as the PRF is increased in order maintain via bottom quality, less of a throughput penalty is incurred with the imaged shaped output 118.

With reference again to FIG. 10, the imaged shaped output 118 enables the peak drilling throughput to be increased over that of the clipped Gaussian by more than 25%. The imaged shaped output 118 also achieves higher throughput than is achieved with a raw focused Gaussian beam, with the added benefits of better via quality (repeatability, sidewall taper, roundness).

With respect to via quality, particularly for blind vias 20*b*, the imaged shaped output of the present invention also permits better taper minimizing performance at higher throughput rates than that available with clipped Gaussian output. In addition to being able to clean dielectric material from the bottom edges of blind via 20*b* faster as discussed above, the imaged shaped output can also clean the dielectric material from the bottom edges of via 20*b* more completely without risking damage to the underlying metallic layer 28 because the uniform shape of pulse 94 virtually eliminates the possibility of creating a hot spot in layer 28 at the bottom center of via 20*b*. The imaged shaped laser output 118 at an appropriate fluence can dwell in a blind via hole indefinitely until a desired cleanliness and taper is achieved.

Moreover, beam shaping components 90 can be selected to produce pulses having an inverted irradiance profile shown in FIG. 6C that is clipped outside dashed lines 180 to facilitate dielectric removal along the outer edges of via 20*b* and thereby further improve taper. The present invention permits a taper ratio of greater than 80% at a maximum throughput with no damage to layer 28, and taper ratios of greater than 95% (for low aspect ratio vias 20) are possible without damage to layer 28. Better than 75% taper ratios are even possible for the smallest vias, from about 5–18 um diameter at the via top with conventional optics although throughput might be diminished.

Figure 11:
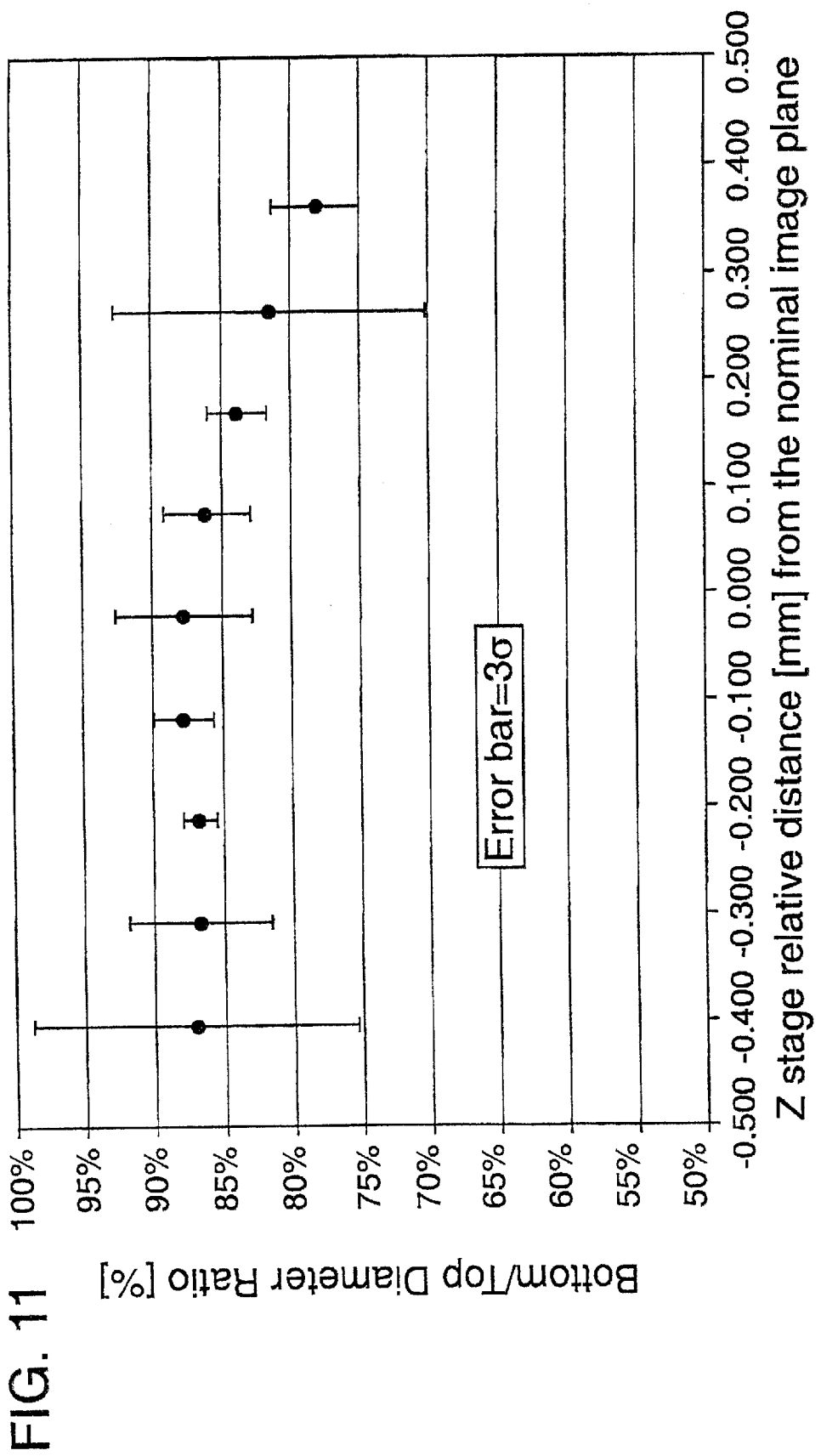
FIG. 11 is a graph of via taper ratio as a function of work surface location relative to the nominal image plane.

FIG. 11 shows the ratio of via bottom diameter to the via top diameter (62 μm vias drilled in 35 μm particulate-reinforced epoxy resin) as a function work surface location relative to the nominal image plane, z=0. With reference to FIG. 11, the nominal image plane is the location where the vias 20 are most circular, with the most sharply defined top edges. Positive values of z represent planes below the nominal image plane, i.e., with the workpiece 22 placed farther from the system optics than distance of separation where z=0. The 3σ error bar is shown for reference because bottom diameter measurements may be difficult to measure reliably.

One hundred vias were drilled and measured at each of nine values of z. The data points represent mean values and the vertical error bars represent the magnitude of three standard deviations from the mean over each 100-sample data set. The largest bottom/top ratio is achieved at the image plane where z=0. Throughout a ±400 μm range, the bottom/top ratio was always greater than 75% at high throughput.

Figure 12:
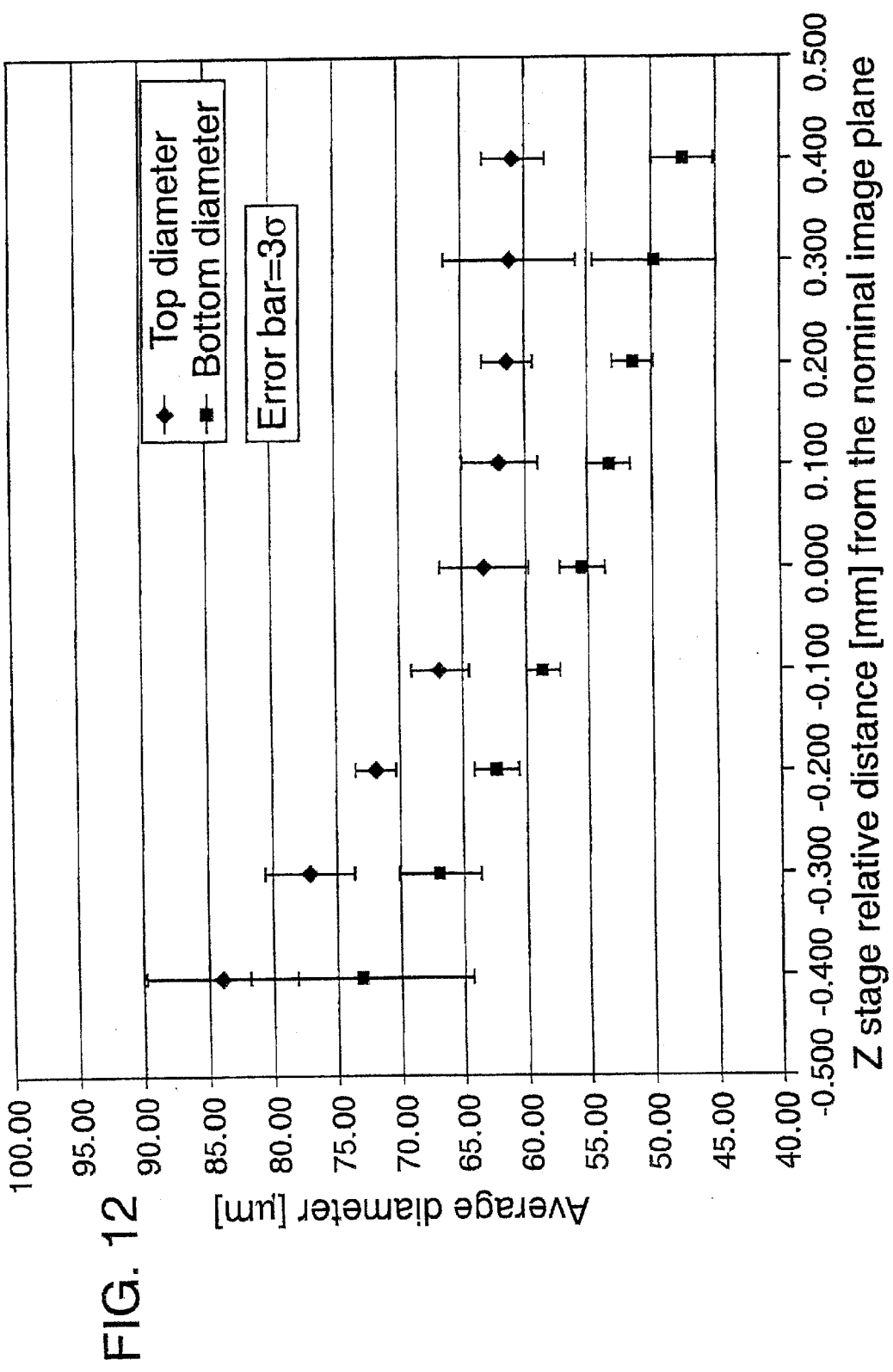
FIG. 12 is a graph of via diameter as a function of work surface location relative to the nominal image plane.

FIG. 12 shows via diameter (in 62-μm vias drilled in 35 μm-particulate reinforced epoxy resin) as a function of work surface location relative to the nominal image plane, where z=0. As the workpiece 22 is moved further above the nominal image plane, the average via top diameter increases steadily. For locations below z=0, the top diameter remains fairly constant out to 400 μm below the image plane. The 3σ diameters are generally held to within ±3 μm of the average value, with exceptions at z=+300 μm and z=−300 μm. For the bottom diameters, in contrast, the average value decreases steadily from locations above to locations below the nominal image plane. Because the diameter and circularity of the via bottom are significantly more difficult to control than the size and roundness of the via top, the bottom diameter is shown for reference only. Statistical process control techniques that could be applied to laser systems 50 and 150 are, therefore, applicable to the characteristics of the via tops.

The data in FIGS. 11 and 12 suggest several approaches to managing depth of focus issues for process robustness. If one wishes to maintain a constant via top diameter over varying material thicknesses and machine conditions, it would be advantageous to set up the process with the work surface located slightly below the nominal image plane at, say z=+200 μm. This would produce a zone of ±200 μm of z variation that could be accommodated with very little effect on the top diameter. If, on the other hand, it is more desirable to maintain a constant via bottom/top diameter ratio, it would be better to set up the process with workpiece 22 located exactly at the nominal image plane. This would ensure that the bottom/top ratio would decrease by no more than 5% over a z range of at least ±200 μm. The viability of either of these approaches depends on whether the other via characteristics remain within acceptable limits as workpiece 22 moves away from the nominal image plane.

Figure 13:
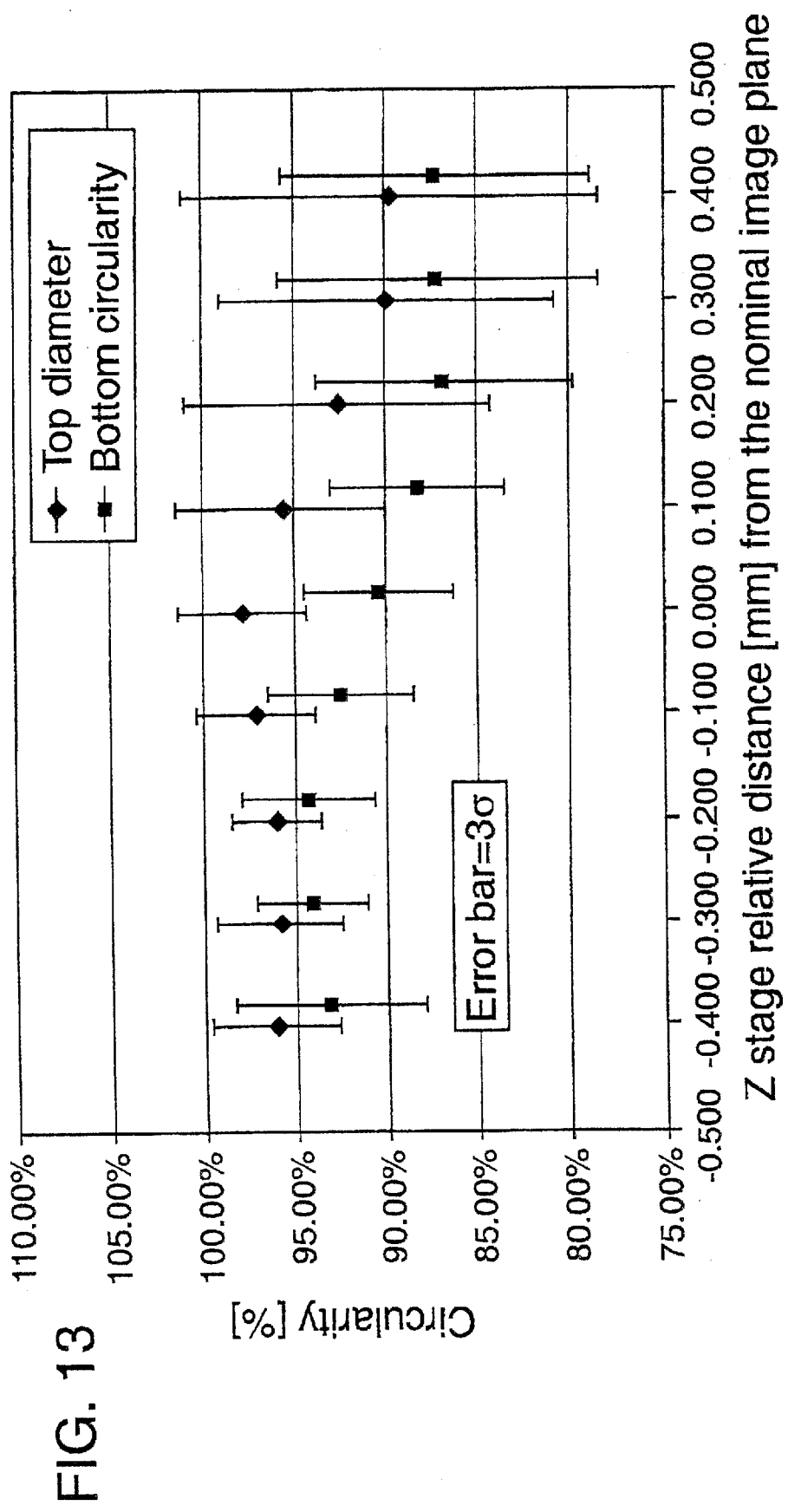
FIG. 13 is a graph of via roundness as a function of work surface location relative to the nominal image plane.

Another issue is via circularity, which is shown in FIG. 13 as a function of z for 62-μm vias drilled in 35-μm particulate-reinforced epoxy resin. With reference to FIG. 13, the bottom circularity data have been displaced to the right of the actual z values for clarity of presentation. The via bottom data are for reference only.

FIG. 13 shows that the circularity, defined as the minor axis/major axis, is always at least 90% over the full ±400 μm z range of the study. For a 62-μm average diameter, 90% circularity corresponds to a major diameter that is about 6.5 μm larger than the minor diameter. However, for positive z values (locations below the nominal image plane), the statistical via-to-via variation in circularity become appreciable. The error bars shown above the data points (average values) are meaningless above 100% circularity, but at, for example, z=+300 μm, FIG. 13 shows that the 3σ outliers may have circularity below 80%.

In general, the imaged shaped output 118 of present invention permits vias 20 to have a roundness or circularity of greater than 90% at higher throughput rates than achievable with clipped Gaussian output. In many cases, imaged shaped output 118 can achieve a roundness of greater than even 95% over the entire range of via sizes at higher throughput rates.

Although some of the examples described herein address some of the maximum output and other factors involving the use of currently available UV DPSS lasers 52, skilled persons will appreciate that as more powerful UV DPSS lasers 52 become available, the via diameters and layer thicknesses in these examples can be increased.

Despite the advantages of imaged shaped output 118, projection imaging may spread the available energy in each imaged shaped laser pulse 118 over a larger area than that typically covered by the ablative portion of a focused raw Gaussian beam. As a result, UV DPSS lasers 52 have energy per pulse limits to the size and thickness of metallic layers 24 and 28 where the laser spot will exceed the ablation threshold fluence for the workpiece materials.

With respect to blind vias, for example, imaged shaped pulses 118 with fluences of 10–12 J/cm$^2$ may be employed to ablate a top copper layer 24 of 5–12 μm thick for small vias up to perhaps 40 μm in diameter. Skilled persons will appreciate that this fluence range implies a fairly slow repetition rate of about 3–6 kHz, for example. Skilled persons will also appreciate that higher fluences may invite adverse consequences such as heating, and the resulting slower repetition rate would negatively impact throughput. As the power obtainable with UV DPSS lasers 52 continues to increase, higher-energy pulses will be available which will extend the shaped imaging technique to through-copper applications for larger via sizes.

In the interim, a preferred method for punching the top metallic layer 24 of blind vias 20b having diameters greater than about 35 μm employs laser system 150 of FIG. 8. The galvanometer mirror pathway 156 is employed to provide focused raw Gaussian output as laser system output 114. The focused raw Gaussian output is used to penetrate the top metallic layer 24, typically using a nonpunching technique, and then the galvanometer mirrors 158 and 162 are controlled to allow the laser output 60 to pass through imaging system 70 for processing dielectric layer 26.

Regardless of how top metallic layer 24 is processed (or it may even be pre-etched), the underlying dielectric layer 26 can subsequently be machined with imaged shaped output 118 with lower fluences at higher repetition rates to produce vias 20 with clean round bottoms and negligible taper as previously described. Typical dielectric processing fluences range from below about 0.8 J/cm$^2$, which does little to no damage to bottom metallic layer 28, to above about 4 J/cm$^2$, which imparts substantial damage to bottom metallic layer 28. Although the preferred fluence is material dependent, fluences of 1.2–1.8 J/cm$^2$ are preferred for most dielectric layers 26 as the imaged shaped pulses 118 approach a copper metallic layer 28.

Skilled persons will appreciate that there is a throughput advantage to processing the upper portion of dielectric layer 24 at a fluence at the higher end of this range and then reducing the fluence (preferably by increasing the repetition rate) toward the lower end of the range as the laser pulses 114 get close to bottom metallic layer 28. For optimum throughput, repetition rates of 12–45 kHz are preferred, 12–15 kHz for larger vias 20b and hard to ablate layers 26 and 30–45 kHz for smaller vias. Skilled persons will appreciate that these repetition rate values will increase as available DPSS laser power improves in the future.

In some applications for medium sized blind vias 20b, it may be desirable to use the fast positioner 78 to process the top metallic layer 24 by non-punching with the focused Gaussian output and then punching through the dielectric with imaged shaped output 118. Skilled persons will also appreciate that the focused raw Gaussian output of laser system 150 can also be employed for processing through-hole vias 20a where the via diameters are too large for efficient imaged shaped output 118 or where speed is more important than roundness or edge quality.

With respect to processing the organic or inorganic dielectric materials of layer 26, they typically have a much lower ablation threshold and are easily ablated with a projection imaging configuration up to the largest desirable via diameters. However, for larger via sizes of about 150 µm to about 200 µm and larger, depending on the properties of the particular material, the energy distribution of imaged shaped output 118 over the via diameter diminishes to a point where the throughput is adversely affected because each laser system pulse 114 removes less material.

In applications where via diameters exceed about 250–300 um in size and edge quality and perfect roundness are not as important as throughput, imaged shaped output 118 or focused Gaussian output of laser system 150 is preferably employed to create via 20 by nonpunch processing employing fast positioner 78. Skilled persons will appreciate that nonpunch processing can produce acceptable taper and roundness for large vias 20 to suit most applications. This preference applies to both through-hole and blind via processing. Skilled persons will also appreciate that the imaged shaped output 118 may be more efficient than the focused Gaussian output for large size vias in many applications.

Figure 14:
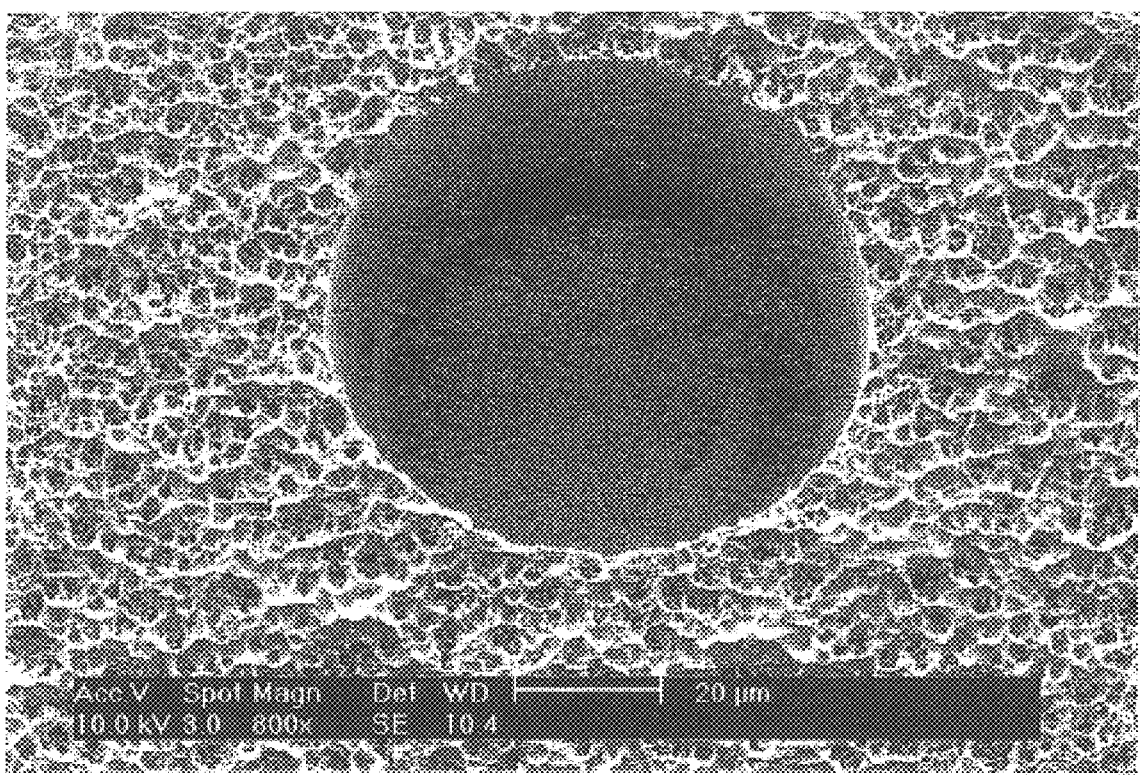
FIG. 14 is a copy of an electron micrograph of a 75-$\mu$m via drilled in 45-$\mu$m thick epoxy resin.

FIG. 14 shows a scanning electron micrograph (SEM) of a typical via drilled in epoxy resin with the imaged shaped output 118 of a UV YAG laser system 50. The via diameter was 75 µm, the resin thickness was 45 µm, and the substrate was prepared by etching away the top copper layer of a resin coated foil on an FR4 core. The bottom (or inner) layer copper was 18 µm (½ oz).

Several features are noteworthy. First, the via sidewalls are exceptionally smooth and straight, and the top edge of the via is sharply defined. Second, owing to image projection of the round aperture, the via is particularly circular, as previously described. Finally, the bottom copper layer is largely undamaged and free of any resin residue.

For this particular test, the beam shaping optics were configured to produce an inverted fluence profile (FIG. 6C) at the work surface that was slightly higher at the spot periphery than in the center. The laser parameters (PRF and number of pulses applied) were then adjusted to produce a work-surface fluence at the periphery that was just above the value that induces melting of the copper. Close inspection of the image reveals that the smooth areas near the edges of the via bottom are regions where the copper was lightly reflowed. Such light reflowing of the copper may be desired in order to ensure that all resin has been removed from the via. This degree of control of the inner layer copper damage is typical of vias 20 produced by imaged shaped output 118.

Figure 15:
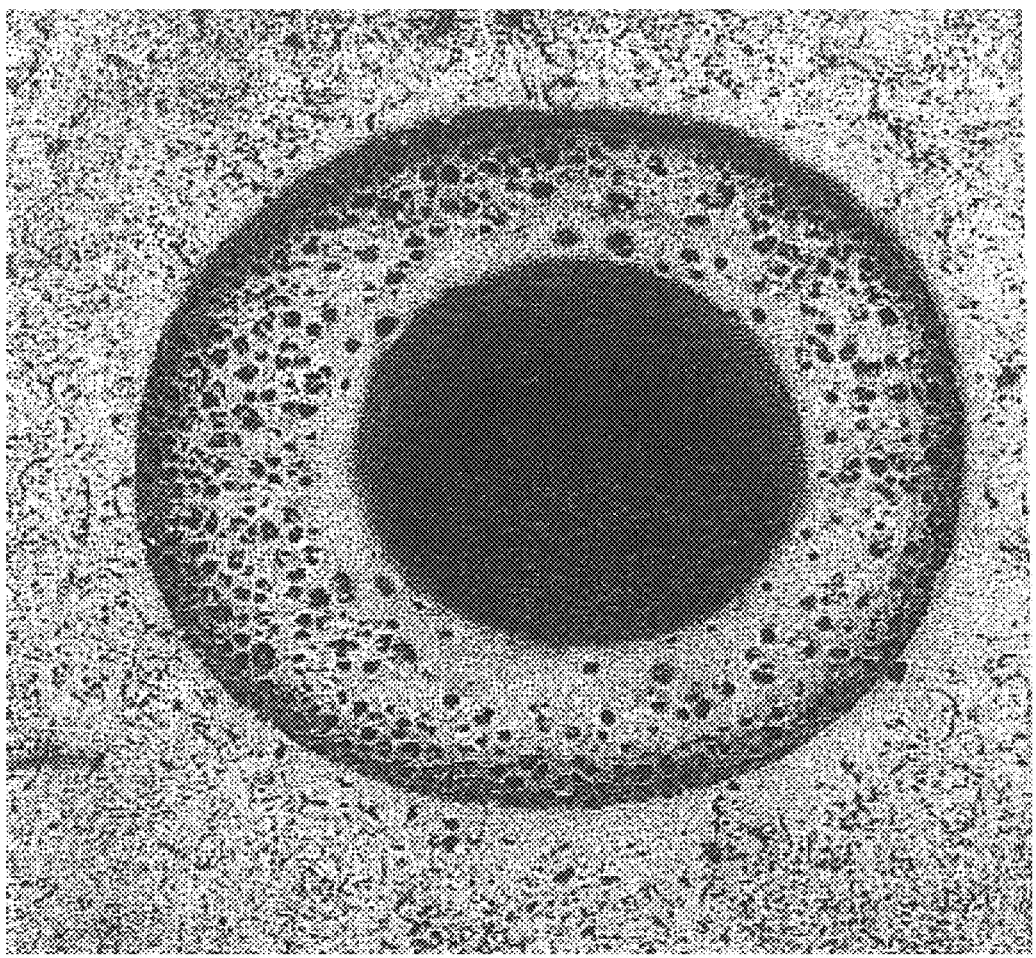
FIG. 15 is a copy of an electron micrograph a 75-$\mu$m via drilled in 45-$\mu$m thick epoxy resin in a 150-$\mu$m thick pre-etched copper opening.

For HDI circuit board microvias, the most common laser drilling technique in resin coated foil constructions makes use of a circular opening pre-etched in the top copper layer. This opening is used as a conformal mask for $CO_2$ laser processing. Layer-to-layer registration difficulty has limited this process to drilling of larger vias (>100 µm) with larger pad sizes (>200 µm). However, positioning system 74 permits the accurate layer-to-layer alignment of a laser drilling system to be coupled with the higher throughput of drilling only the dielectric resin. In this new process, the outer layer copper is pre-etched to the approximate size of the inner layer land pad, and the laser is then used to align and drill a smaller via within this opening. A scanning electron micrograph of an exemplary via 20 that could be created by this process is presented in FIG. 15, which shows an imaged shaped 75-µm via through 45-µm epoxy resin in a 150-µm pre-etched copper opening.

Skilled persons will appreciate that the beam shaping and imaging techniques described herein not only permit enhanced via roundness and edge quality, but also permit enhanced repeatability and positioning accuracy such as in the exact center of pads and may be useful for improving impedance control and predictability of the electronic workpieces.

Further comparative data between shaped imaging and clipped Gaussian techniques, including color electron micrographs, can be found in the article entitled "High Quality Microvia Formation with Imaged UV YAG Lasers," which was presented as a portion of the Technical Proceedings of the IPC Printed Circuits Expo 2000 in San Diego, Calif. on Apr. 6, 2000.

It will be obvious to those having skill in the art that many changes may be made to the details of the above-described embodiments of this invention without departing from the underlying principles thereof. The scope of the present invention should, therefore, be determined only by the following claims.

What is claimed is:

1. A method for increasing the throughput for drilling vias in a multilayered workpiece including at least first and second layers of respective first layer and second layer materials having respective first and second ablation fluence thresholds, comprising:

generating first Gaussian laser output having a first Gaussian energy and a substantially Gaussian irradiance profile at wavelength shorter than 400 nm;

propagating the first Gaussian laser output along an optical path through a diffractive optical element to convert the first Gaussian laser output into a first more uniformly shaped output;

propagating a major portion of the first uniformly shaped output through an aperture to convert the first uniformly shaped output into a first apertured shaped output having a first apertured shaped energy that is greater than 50% of the first Gaussian energy of the first Gaussian laser output;

propagating the first apertured shaped output through one or more imaging lens components to provide first imaged shaped output;

applying the first imaged shaped output to a target location on the workpiece to remove first layer material within the target location, the first imaged shaped output having a first energy density over a first spot area, and the first energy density being greater than the first ablation fluence threshold but less than the second ablation fluence threshold to form a via.

2. The method of claim 1 in which the via has a minimum diameter $d_{min}$, a maximum diameter $d_{max}$, and a roundness of greater than 0.9, where the roundness equals $d_{min}/d_{max}$.

3. The method of claim 2 in which the via has a roundness of greater than 0.95.

4. The method of claim 1 in which the via has a bottom diameter $d_b$, a top diameter $d_t$, and a taper ratio of greater than 0.5, where the taper ratio equals $d_b/d_t$.

5. The method of claim 1 in which the via has a taper ratio of greater than 0.75.

6. The method of claim 1 in which the first apertured shaped energy is greater than 65% of the first Gaussian energy.

7. The method of claim 6 in which the first apertured shaped energy is greater than 75% of the first Gaussian energy.

8. The method of claim 1 in which the first imaged shaped energy is greater than 45% of the first Gaussian energy.

9. The method of claim 8 in which the first imaged shaped energy is greater than 55% of the first Gaussian energy.

10. The method of claim 1 in which the first energy density is less than or equal to about 2 J/cm$^2$.

11. The method of claim 1 in which the wavelength is about 355 nm or about 266 nm.

12. The method of claim 1 in which the first layer material comprises a dielectric material and the second layer material comprises a metal.

13. The method of claim 12 in which the dielectric material comprises an organic dielectric material and the metal comprises copper.

14. The method of claim 13 in which the organic dielectric material comprises an inorganic reinforcement material.

15. The method of claim 1 further comprising:
removing the first layer material by punching.

16. The method of claim 1 further comprising:
removing the first layer material by non-punching.

17. The method of claim 1 in which the first layer material is positioned between two layers of second layer material, further comprising, prior to generating first Gaussian laser output:

generating second Gaussian laser output having a second Gaussian energy and a substantially Gaussian irradiance profile at wavelength shorter than 400 nm;

propagating the second Gaussian laser output along the optical path through the diffractive optical element to convert the second Gaussian laser output into a second more uniformly shaped output;

propagating a major portion of the second uniformly shaped output through the aperture to convert the second uniformly shaped output into a second apertured shaped output having a second apertured shaped energy that is greater than 50% of the second Gaussian energy of the second Gaussian laser output;

propagating the second apertured shaped output through one or more imaging lens components to provide second imaged shaped output;

applying the second imaged shaped output to the target location on the workpiece to remove second layer material within the target location, the second imaged shaped output having a second energy density over the spot area, and the second energy density being greater than the second ablation fluence threshold to remove second layer material.

18. The method of claim 17 in which the second energy density is greater than or equal to about 10 J/cm$^2$.

19. The method of claim 17 further comprising:
generating the second Gaussian laser output at a second pulse repetition frequency; and
generating the first Gaussian laser output at a first pulse repetition frequency that is higher than the second pulse repetition frequency.

20. The method of claim 17 further comprising:
directing the second and first imaged shaped outputs sequentially to a first target location form a first via; and
directing the second and first imaged shaped outputs sequentially to a second target location form a second via.

21. The method of claim 17 further comprising:
directing the second imaged shaped outputs to a first target location to remove second layer material;
directing the second imaged shaped outputs to a second target location to remove second layer material;
then directing the first imaged shaped output to a first target location to remove first layer material; and
directing the first imaged shaped output to a second target location to remove first layer material.

22. The method of claim 17 further comprising:
removing the second layer material by non-punching; and
removing the first layer material by punching.

23. The method of claim 17 further comprising:
removing the second and first layer materials by non-punching.

24. The method of claim 17 in which the first and second Gaussian energies are different.

25. The method of claim 17 in which the second apertured shaped energy is greater than 65% of the first Gaussian energy.

26. The method of claim 25 in which the second apertured shaped energy is greater than 75% of the first Gaussian energy.

27. The method of claim 17 in which the second imaged shaped energy is greater than 45% of the first Gaussian energy.

28. The method of claim 1 in which the first layer material is positioned between two layers of second layer material, further comprising, prior to generating first Gaussian laser output:

generating second Gaussian laser output having a second Gaussian energy and a substantially Gaussian irradiance profile at wavelength shorter than 400 nm;

propagating the second Gaussian laser output along a second optical path that avoids the diffractive optical element and the aperture;

applying the second Gaussian laser output to the target location on the workpiece to remove second layer material within the target location, the second Gaussian output having a second energy density over the spot area, and the second energy density being greater than the second ablation fluence threshold to remove second layer material; and changing from the second optical path to the optical path to provide imaged shaped output.

29. The method of claim 28 further comprising:
generating the second Gaussian laser output at a second pulse repetition frequency; and generating the first Gaussian laser output at a first pulse repetition frequency that is higher than the second pulse repetition frequency.

30. The method of claim 28 further comprising:

removing the second layer material by non-punching; and removing the first layer material by punching.

31. A laser system, comprising:

a diode-pumped, solid-state laser for generating ultraviolet Gaussian laser output having a Gaussian energy along an optical path;

a diffractive optical element positioned along the optical path for converting the Gaussian laser output to shaped output having a central irradiance profile of high and uniform intensity and an outer irradiance profile of low intensity;

an aperture positioned along the optical path for clipping a major portion of the outer irradiance profile of the shaped output and passing at least 50% of the Gaussian energy through the aperture to produce apertured shaped output having apertured shaped energy;

one or more imaging lens components for converting the apertured shaped output into image shaped output; and a positioning system for directing the imaged shaped output toward a target location on a workpiece to form a via.

32. The laser system of claim 31, further comprising:

a pair of beam directing mirrors positioned along the optical path, the diffractive optical element and the aperture being positioned optically between the beam directing mirrors, for diverting the Gaussian laser output along an alternative optical path that avoids the diffractive optical element and the aperture such that the beam positioning system directs the Gaussian output toward the workpiece.

33. The laser system of claim 31 in which the diffractive optical element is a first diffractive optical element, the aperture is a first aperture having a first size, and the first diffractive optical element and the first aperture cooperate to produce a substantially uniform first energy density over a first spot area on the workpiece.

34. The laser system of claim 33 in which the first diffractive optical element and the first aperture are removable and replaceable by a second diffractive optical element and a second aperture which cooperate to determine a second substantially uniform energy density over a second spot area on the workpiece.

35. The laser system of claim 33, further comprising:

a first removable imaging optics rail that houses the first diffractive optical element and the first aperture, the first imaging optics rail being replaceable with a second imaging optics rail having a second diffractive optical element and a second aperture which cooperate to determine a second energy density over a second spot area at the target location on the workpiece.

36. The laser system of claim 31, further comprising:

a removable imaging optics rail that houses the diffractive optical element and the aperture, such that removal of the imaging optics rail permits the Gaussian laser output to impinge the workpiece at the target location.

37. The laser system of claim 31 in which the apertured shaped energy is greater than 65% of the Gaussian energy.

38. The laser system of claim 37 in which the apertured shaped energy is greater than 75% of the Gaussian energy.

39. The laser system of claim 31 in which the via has a minimum diameter $d_{min}$, a maximum diameter $d_{max}$, and a roundness of greater than 0.9, where the roundness equals $d_{min}/d_{max}$.

40. The laser system of claim 31 in which the via has a bottom diameter $d_b$, a top diameter $d_t$, and a taper ratio of greater than 0.5, where the taper ratio equals $d_b/d_t$.

41. The laser system of claim 31 in which the first energy density is less than or equal to about 2 J/cm$^2$.

42. The laser system of claim 31 in which the wavelength is about 355 nm or about 266 nm.

43. The laser system of claim 31 in which the via comprises first and second layer materials, and the first layer material comprises a dielectric material and the second layer material comprises a metal.

44. The laser system of claim 43 in which the dielectric material comprises an organic dielectric material and the metal comprises copper.

45. The laser system of claim 31 further comprising a variable beam expander positioned along the optical path between the aperture and the workpiece.

46. The laser system of claim 31 further comprising rapidly variable control electronics for rapidly changing control of a Q-switch for effecting a rapid repetition rate change in the Gaussian laser output to convert it to a second Gaussian laser output having a second pulse energy.

* * * * *

UNITED STATES PATENT AND TRADEMARK OFFICE
CERTIFICATE OF CORRECTION

PATENT NO. : 6,433,301 B1
DATED : August 13, 2002
INVENTOR(S) : Corey M. Dunsky et al.

It is certified that error appears in the above-identified patent and that said Letters Patent is hereby corrected as shown below:

Title page,
Item [60], Related U.S. Application Data, "Provisional application No. 60/193,660" should read -- Provisional application No. 60/193,668 --;
Item [57], ABSTRACT,
Line 6, "to provide imaged to provide imaged shaped" should read -- to provide image shaped --.

Column 2,
Line 24, "pulse is clipped" should read -- pulse are clipped --.

Column 4,
Line 27, "FIGS. 5A-5C is" should read -- FIGS. 5A-5C are --;
Line 32, "of three respective" should read -- of four respective --;
Line 55, "micrograph a" should read -- micrograph of a --;
Line 62, "though" should read -- through --.

Column 6,
Line 22, "employs includes at" should read -- employs at --;
Line 23, "supports" should read -- support --;
Line 24, "permits" should read -- permit --.

Column 7,
Line 7, "$Z>Z_{01}$" should read -- $Z>Z_0^1$ --;
Line 13, "they also focus" should read -- if also focuses --;
Line 16, "down stream" should read -- downstream --;
Line 43, "straight forward" should read -- straightforward --;
Line 56, "laser system50" should read -- laser system 50 --.

Column 8,
Line 8, "reflective coating other" should read -- reflective coating or other --;
Line 10, "produce a highly" should read -- produce highly --.

Column 9,
Line 7, "25" should read -- 25 --;
Lines 49-50, "stage positioner may" should read -- stage positioner 76 may --.

Column 10,
Lines 23-24, "laser system having output 114" should read -- laser system output 114 --;
Line 30, "300µm; and a repetition" should read -- 300 µm; a repetition --.

UNITED STATES PATENT AND TRADEMARK OFFICE
CERTIFICATE OF CORRECTION

PATENT NO. : 6,433,301 B1
DATED : August 13, 2002
INVENTOR(S) : Corey M. Dunsky et al.

It is certified that error appears in the above-identified patent and that said Letters Patent is hereby corrected as shown below:

Column 12,
Line 48, "output of the" should read -- output 118 of the --.

Column 13,
Line 4, "5-18 um diameter" should read -- 5-18 µm diameter --.

Column 14,
Line 7, "variation" should read -- variations --.

Column 15,
Line 16, "by non-punching with" should read -- by nonpouching with --;
Line 35, "250-300 um" should read -- 250-300 µm --.

Column 18,
Lines 13 and 15, "location form" should read -- location to form --.

Signed and Sealed this

Twenty-seventh Day of January, 2004

JON W. DUDAS
*Acting Director of the United States Patent and Trademark Office*